US012633958B2

(12) United States Patent
Zhang et al.

(10) Patent No.: US 12,633,958 B2
(45) Date of Patent: May 19, 2026

(54) MATCHING CIRCUIT, RADIO FREQUENCY FRONT-END CIRCUIT, RADIO TRANSCEIVER APPARATUS, AND ELECTRONIC DEVICE

(71) Applicant: HUAWEI TECHNOLOGIES CO., LTD., Guangdong (CN)

(72) Inventors: Mingming Zhang, Shanghai (CN); Qilin Qiu, Shenzhen (CN); Hsianghui Chang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 313 days.

(21) Appl. No.: 18/577,255

(22) PCT Filed: Jul. 6, 2022

(86) PCT No.: PCT/CN2022/104219
§ 371 (c)(1),
(2) Date: Jan. 6, 2024

(87) PCT Pub. No.: WO2023/280236
PCT Pub. Date: Jan. 12, 2023

(65) Prior Publication Data
US 2025/0015828 A1     Jan. 9, 2025

(30) Foreign Application Priority Data
Jul. 9, 2021     (CN) ......................... 202110778927.8

(51) Int. Cl.
| | |
|---|---|
| H04B 1/40 | (2015.01) |
| H03F 3/195 | (2006.01) |
| H03H 7/38 | (2006.01) |

(52) U.S. Cl.
CPC ............... *H04B 1/40* (2013.01); *H03F 3/195* (2013.01); *H03H 7/38* (2013.01); *H03F 2200/294* (2013.01); *H03F 2200/451* (2013.01)

(58) Field of Classification Search
CPC ..... H04B 1/40; H03F 3/195; H03F 2200/294; H03F 2200/451; H03H 7/38
See application file for complete search history.

(56) References Cited

U.S. PATENT DOCUMENTS

| | | | | |
|---|---|---|---|---|
| 2006/0135084 A1* | 6/2006 | Lee | .......................... | H04B 1/18 455/78 |
| 2011/0062336 A1* | 3/2011 | Ben-Bassat | ............. | H10F 30/10 257/E31.093 |

(Continued)

FOREIGN PATENT DOCUMENTS

| | | |
|---|---|---|
| CN | 102263572 A | 11/2011 |
| CN | 112514248 A | 3/2021 |

OTHER PUBLICATIONS

J. D. Dunworth et al:"A 28GHz Bulk-CMOS Dual-Polarization Phased-Array Transceiver with 24 Channels for 5G User and Basestation Equipment",2018 IEEE International Solid-State Circuits Conference, Feb. 11-15, 2018, total 3 pages.

(Continued)

*Primary Examiner* — Nathan A Mitchell

(57) ABSTRACT

A matching circuit, a radio frequency front-end circuit, a radio transceiver apparatus, and an electronic device are provided. The radio frequency front-end circuit includes a low noise amplifier and a power amplifier each coupled to an antenna through a matching circuit. The matching circuit includes a transformer, a capacitor, a first switch, and a first inductor element. The transformer is coupled to the power amplifier and the antenna. The capacitor is coupled to the transformer and to the low noise amplifier. The first switch is coupled to the capacitor and to the transformer and is (Continued)

grounded. The first inductor element is coupled to the capacitor and to the first switch and is grounded. A resonant network formed by the first inductor element and the first switch enables the radio frequency front-end circuit to in a wide frequency band.

20 Claims, 18 Drawing Sheets

(56) References Cited

U.S. PATENT DOCUMENTS

| 2011/0169587 | A1* | 7/2011 | Wang | H04B 1/52 |
| | | | | 333/124 |
| 2013/0231155 | A1* | 9/2013 | Sheynman | H03G 3/20 |
| | | | | 455/248.1 |
| 2014/0199951 | A1* | 7/2014 | Yu | H04B 1/44 |
| | | | | 455/83 |
| 2015/0094117 | A1* | 4/2015 | Conta | H03F 3/45179 |
| | | | | 455/560 |
| 2015/0333791 | A1 | 11/2015 | Anderson et al. | |
| 2019/0074862 | A1* | 3/2019 | Wang | H04B 1/0458 |
| 2020/0127605 | A1* | 4/2020 | Vida | H03H 7/38 |
| 2022/0278703 | A1* | 9/2022 | Shounai | H04B 1/0057 |

OTHER PUBLICATIONS

Yun Wang et al:"A compact 39-GHz 17.2-dBm power amplifier for 5G communication in 65-nm CMOS", 2018 IEEE International Symposium on Radio-Frequency Integration Technology (RFIT), Aug. 15-17, 2018, total 3 pages.

Yusheng Yin et al:"A 37-42 GHz 8x8 Phased-Array for 5G Communication Systems with 48-50 dBm EIRP",2019 IEEE/MTT-S International Microwave Symposium, Jun. 2-7, 2019, total 4 pages.

Li Gao et al:"A 20-44-GHz Image-Rejection Receiver With >75-dB Image-Rejection Ratio in 22-nm CMOS FD-SOI for 5G Applications", IEEE Transactions on Microwave Theory and Techniques, Mar. 23, 2020, total 10 pages.

Tso-Wei Li et al:"A Continuous-Mode 23.5-41GHz Hybrid Class-F/F-1 Power Amplifier with 46% Peak PAE for 5G Massive MIMO Applications",2018 IEEE Radio Frequency Integrated Circuits Symposium, Jun. 10-12, 2018, total 4 pages.

Hisashi Onozawa (Nokia):"Email discussion summary for [96e][135] NR_47GHz_Band", 3GPP TSG-RAN WG4 Meeting # 96-e, Electronic Meeting, Aug. 17-21, 2020, R4-200XXXX, total 18 pages.

Tzu-Yuan Huang et al:"A 26-to-60GHz Continuous Coupler-Doherty Linear Power Amplifier for Over-An-Octave Back-Off Efficiency Enhancement", ISSCC 2021 / SESSION 26 / RF Power-Amplifier and Front-End Techniques / 26.1, Feb. 13-22, 2021, total 3 pages.

David del Rio et al: "Multi-Gbps Tri-Band 28/38/60-GHz CMOS Transmitter for Millimeter-Wave Radio System-on-Chip",2019 IEEE/MTT-S International Microwave Symposium, Jun. 2-7, 2019, total 4 pages.

Mehmet Parlak et al:"A Passive I/Q Millimeter-Wave Mixer and Switch in 45-nm CMOS SOI", IEEE Transactions on Microwave Theory and Techniques, vol. 61, No. 3, Mar. 2013, total 9 pages.

Hong-Teuk Kim et al:"A 28-GHz CMOS Direct Conversion Transceiver With Packaged 2x4 Antenna Array for 5G Cellular System", IEEE Journal of Solid-State Circuits, vol. 53, No. 5, May 2018, total 15 pages.

Li Gao et al:"A 24-43 GHz LNA with 3.1-3.7 dB Noise Figure and Embedded 3-Pole Elliptic High-Pass Response for 5G Applications in 22 nm FDSOI",2019 IEEE Radio Frequency Integrated Circuits Symposium, Jun. 2-4, 2019, total 4 pages.

* cited by examiner

An electronic device receives a radio frequency signal on a network side through an antenna — S171

An MN receives a radio frequency signal from the antenna, and performs frequency tuning on the radio frequency signal for a plurality of times, to enable the antenna to operate in an expected operating frequency band — S172

FIG. 17

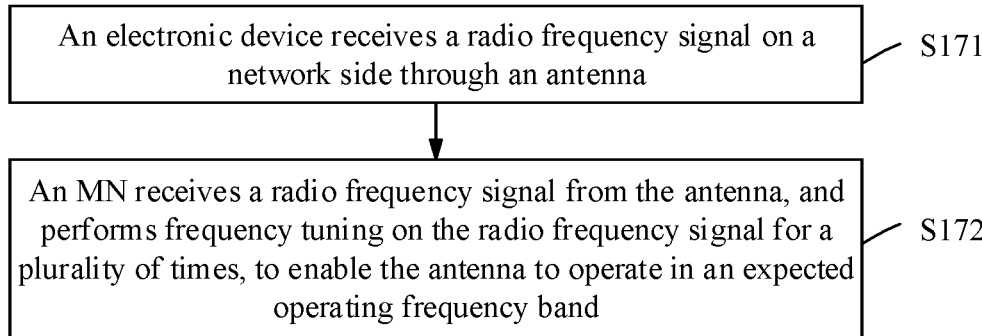

300

304 — Antenna

303 — Radio frequency front-end circuit

305 — MN

301 — Processor

302 — Memory

FIG. 18

MATCHING CIRCUIT, RADIO FREQUENCY FRONT-END CIRCUIT, RADIO TRANSCEIVER APPARATUS, AND ELECTRONIC DEVICE

CROSS-REFERENCE TO RELATED APPLICATIONS

This application is a national stage of International Application No. PCT/CN2022/104219 filed on Jul. 6, 2022, which claims priority to Chinese Patent Application No. 202110778927.8 filed on Jul. 9, 2021. Both of the aforementioned applications are hereby incorporated by reference in their entireties.

TECHNICAL FIELD

This application relates to the field of communication technologies, and in particular, to a matching circuit, a radio frequency front-end circuit, a radio transceiver apparatus, and an electronic device.

BACKGROUND

With development of wireless communication technologies, a millimeter wave (millimeter wave, mmW) may be applied to mobile terminals. Currently, a majority of commonly used millimeter-wave chips operate in a single broadband frequency band, for example, a frequency band from 24.25 GHz to 29.5 GHz or a frequency band from 37 GHz to 43.5 GHZ, and a relative bandwidth of the millimeter-wave chips is less than 20%. However, to implement miniaturization and a flexible design of terminals, a single millimeter-wave chip usually needs to operate in a plurality of frequency bands (for example, the frequency band from 24.25 GHz to 29.5 GHz and the frequency band from 37 GHz to 43.5 Ghz). In addition, with further opening of a millimeter-wave spectrum and application of a millimeter-wave band in the short-distance communication and wireless sensing field, full-frequency band integration of a frequency band from 24.25 GHz to 64 GHz even needs to be implemented on a single chip, and a high relative bandwidth needs to be implemented. Therefore, a great design challenge is faced.

SUMMARY

In view of this, a matching network (or a matching circuit), a radio frequency front-end circuit, a radio transceiver apparatus, an electronic device, and a tuning method need to be provided, to implement multi-band matching of the radio frequency front-end circuit (or a radio transceiver apparatus including the radio frequency front-end circuit, or an electronic device including the radio frequency front-end circuit).

It should be understood that the matching network in this application may also be referred to as the matching circuit, a matching circuit network, or the like.

According to a first aspect, an embodiment of this application provides a matching circuit used in a radio frequency front-end circuit. The radio frequency front-end circuit further includes a low noise amplifier and a power amplifier. Both the low noise amplifier and the power amplifier are coupled to an antenna by using the matching circuit. The matching circuit includes a transformer, a capacitor, a first switch, and a first inductor element. The transformer is electrically connected to the power amplifier and the antenna. One end of the capacitor is electrically connected to the transformer, and the other end of the capacitor is electrically connected to the low noise amplifier. One end of the first switch is electrically connected between the capacitor and the transformer, and the other end of the first switch is grounded. One end of the first inductor element is electrically connected between the capacitor and the first switch, and the other end of the first inductor element is grounded. It is clear that, in the first aspect of this application, the first inductor element is disposed, to enable the first inductor element and the first switch to form a first resonant network, and therefore impedance matching or tuning may be performed on the radio frequency front-end circuit. This allows the radio frequency front-end circuit to include at least one resonance point in an operating frequency band, that is, the radio frequency front-end circuit operates in a wide frequency band. The radio frequency front-end circuit may have a high relative bandwidth, for example, the relative bandwidth is greater than 100%. A circuit structure of the matching circuit in this application is simple, and the transformer may be co-designed with the low noise amplifier and the power amplifier. For example, the transformer may form a part of a circuit for input matching of the low noise amplifier. This may effectively reduce deterioration of a gain, a noise figure, a power added efficiency, linearity, and the like, and does not cause an increase of an overall circuit area.

In a possible design, the first inductor element and the first switch generate a first resonance point, and the transformer and the antenna generate a second resonance point. It is clear that, the radio frequency front-end circuit includes at least one resonance point in an operating frequency band, for example, may generate the first resonance point and the second resonance point. To be specific, the radio frequency front-end circuit operates in a wide frequency band, and has a high relative bandwidth, for example, the relative bandwidth is greater than 100%.

In a possible design, the matching circuit further includes a second inductor element, one end of the second inductor element is electrically connected between the capacitor and the low noise amplifier, and the other end of the second inductor element is grounded. It is clear that, the second inductor element may be disposed to form another resonant network with the capacitor and the first inductor element, to enable the radio frequency front-end circuit to include at least one resonance point in an operating frequency band, further expanding a frequency bandwidth of the radio frequency front-end circuit. This allows the radio frequency front-end circuit to operate in at least two frequency bands, that is, operate in a wide frequency band, and have a high relative bandwidth, for example, the relative bandwidth is greater than 100%.

In a possible design, the capacitor, the first inductor element, and the second inductor element generate a third resonance point. It is clear that, the radio frequency front-end circuit includes at least one resonance point in an operating frequency band, for example, may generate three resonance points. To be specific, the radio frequency front-end circuit operates in a wide frequency band, and has a high relative bandwidth, for example, the relative bandwidth is greater than 100%.

In a possible design, the capacitor, the first inductor element, and the second inductor element form a 3-order π-type high-pass filter. It is clear that, in this design, the capacitor, the first inductor element, and the second inductor element form a resonant network, and form a high- and low-pass filter, to effectively perform input and noise matching of a broadband low noise amplifier.

In a possible design, the low noise amplifier includes a bias circuit, and the bias circuit includes the second inductor element. It is clear that, in this design, the second inductor element forms a component of the bias circuit, to reuse an inductor of the radio frequency front-end circuit, further simplifying a circuit structure of the radio frequency front-end circuit and effectively reducing costs.

According to a second aspect, an embodiment of this application provides a radio frequency front-end circuit. The radio frequency front-end circuit includes a low noise amplifier and a power amplifier. The radio frequency front-end circuit further includes the matching circuit in the first aspect and the possible designs, and the matching circuit is coupled to the low noise amplifier and the power amplifier.

In a possible design, the low noise amplifier includes a bias circuit, and the bias circuit is coupled to a capacitor and forms a common-source architecture.

In a possible design, the bias circuit includes a switching transistor and two inductors, one end of one of the two inductors is electrically connected to the capacitor, the other end is electrically connected to a gate of the switching transistor, a source of the switching transistor is grounded through the other inductor of the two inductors, and a drain of the switching transistor is configured to output a radio frequency signal.

In a possible design, the low noise amplifier includes a bias circuit, and the bias circuit is coupled to a capacitor and forms a common-gate architecture or a cascode architecture.

According to a third aspect, an embodiment of this application provides a radio transceiver apparatus. The radio transceiver apparatus includes an antenna and a radio frequency front-end circuit. The radio frequency front-end circuit is coupled to the antenna and is packaged with the antenna. The radio frequency front-end circuit includes a low noise amplifier and a power amplifier. The radio frequency front-end circuit further includes the matching circuit in the first aspect and the possible designs. Both the low noise amplifier and the power amplifier are coupled to the antenna by using the matching circuit.

According to a fourth aspect, an embodiment of this application provides an electronic device. The electronic device includes an antenna. The electronic device further includes the matching circuit in the first aspect and the possible designs, and the matching circuit is coupled to the antenna, to enable the electronic device to operate in a plurality of frequency bands.

According to a fifth aspect, an embodiment of this application provides a tuning method applied to an electronic device. The electronic device includes a matching circuit and an antenna, and the matching circuit is coupled to the antenna. The tuning method includes the following steps.

The electronic device receives a radio frequency signal on a network side through the antenna.

The matching circuit receives a radio frequency signal from the antenna, and tunes the radio frequency signal, to enable the electronic device to operate in a plurality of frequency bands.

The matching circuit is the matching circuit in the first aspect and the possible designs.

In addition, for technical effects brought by any possible design manner in the second aspect to the fifth aspect, refer to technical effects brought by different design manners in the matching circuit part. Details are not described herein.

BRIEF DESCRIPTION OF DRAWINGS

To describe the technical solutions of embodiments of this application more clearly, the following briefly describes the accompanying drawings used in describing embodiments. It is clear that, the accompanying drawings described in the following are merely some embodiments of this application, and a person of ordinary skill in the art may still derive other drawings from these accompanying drawings without creative efforts.

FIG. 17 is a flowchart of a tuning method according to an embodiment of this application; and FIG. 18 is a schematic diagram of a structure of an electronic device according to an embodiment of this application.

LIST OF REFERENCE NUMERALS OF MAIN ELEMENTS

Figure 1:
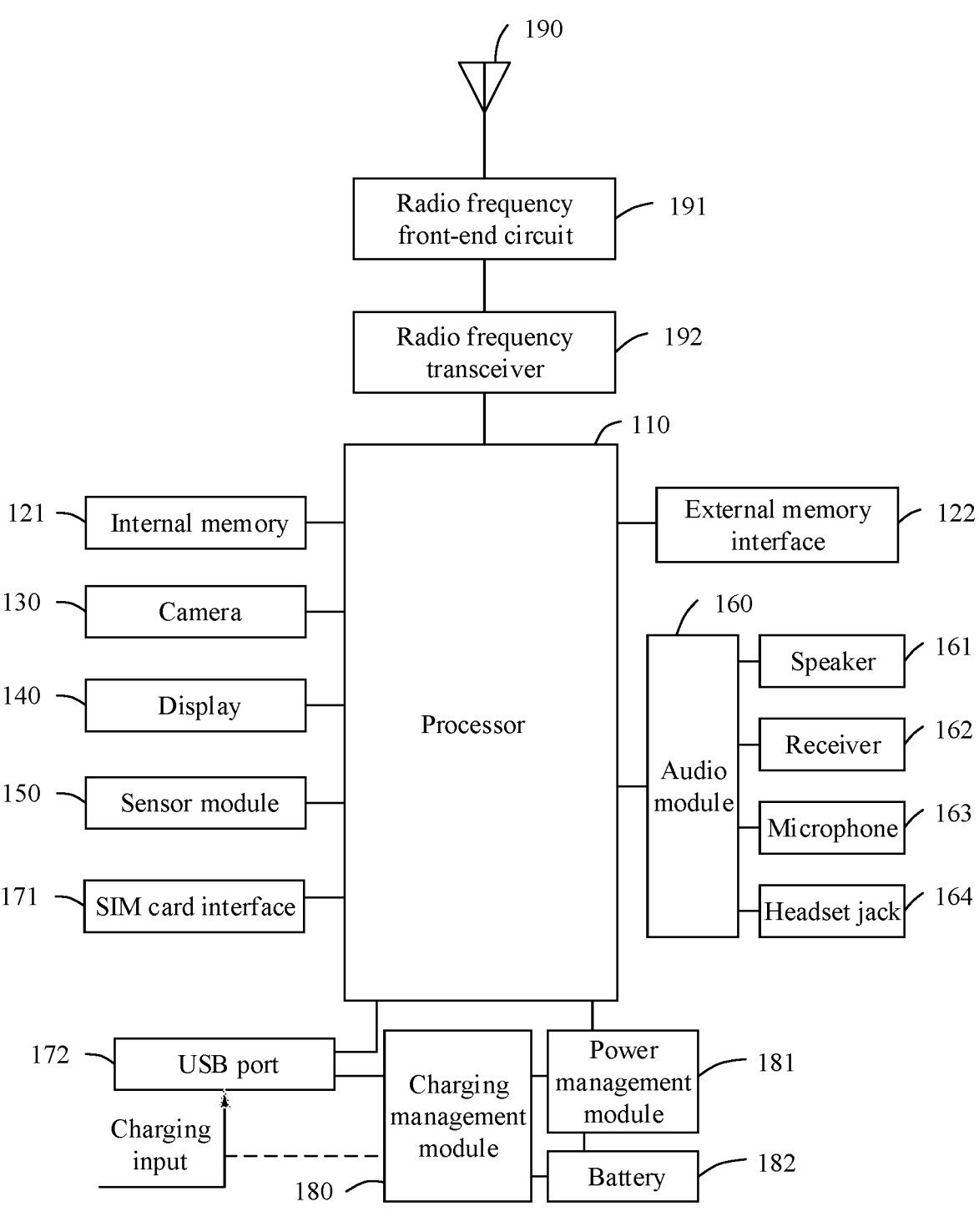
FIG. 1 is a schematic diagram of a hardware structure of an electronic device according to an embodiment of this application.

| | |
|---|---|
| Electronic device | 100, 300 |
| Processor | 110, 301 |
| Internal memory | 121 |

-continued

| External memory interface | 122 |
|---|---|
| Camera | 130 |
| Display | 140 |
| Sensor module | 150 |
| Audio module | 160 |
| Speaker | 161 |
| Receiver | 162 |
| Microphone | 163 |
| Headset jack | 164 |
| SIM card interface | 171 |
| USB port | 172 |
| Charging management module | 180 |
| Power management module | 181 |
| Battery | 182 |
| Antenna | 190, 201, 304 |
| Radio frequency front-end circuit | 191, 191a, 191b, 191c, 191d, 191e, 191f, 191g, 303 |
| Radio frequency transceiver | 192 |
| LNA | 193, 193g |
| PA | 194 |
| MN | 195, 195a, 195b, 195c, 195d, 195e, 195f, 195g, 305 |
| First switching element | SW1, SW1b |
| Second switching element | SW2, SW2b |
| First switch | S1 |
| Second switch | S2 |
| Transformer | T1, T2, T3 |
| Primary coil | T11, T21, Lp |
| Secondary coil | T12, T22, Ls |
| First inductor | Lm1 |
| Capacitor | Cm |
| First equivalent capacitor | Cn |
| Second equivalent capacitor | Cp |
| Resonant network | Q1, Q2, Q3 |
| Second inductor | Lm2 |
| Third inductor | Lb1 |
| Fourth inductor | Lb2 |
| Bias circuit | 196 |
| Switching transistor | M1, M2 |
| Fifth inductor | Lg |
| Sixth inductor | Ldeg |
| First inductor element | Lm |
| Second inductor element | Lb |
| First filter | P1 |
| Second filter | P2 |
| Radio transceiver apparatus | 200 |
| RFFE IC | 202 |
| Die | 203 |
| Partition | 204 |
| Interface | 205 |
| Substrate | 206 |
| First surface | 206a |
| Terminal | 207 |
| Second surface | 206b |
| Memory | 302 |

In the following specific implementations, this application is further described with reference to the accompanying drawings.

DESCRIPTION OF EMBODIMENTS

It should be understood that in this application, unless otherwise specified, "/" means "or". For example, A/B may represent A or B. "And/or" in this application describes only an association relationship between associated objects and represents that three relationships may exist. For example, A and/or B may represent the following three cases: Only A exists, both A and B exist, and only B exists. "At least one" indicates one or more, and "a plurality of" indicates two or more.

In this application, "example", "in some embodiments", "in some other embodiments", or the like represents giving an example, an illustration, or a description. Any embodiment or design scheme described as an "example" in this application should not be explained as being more preferable or having more advantages than another embodiment or design scheme. Exactly, the term "example" presents a concept in a specific manner.

In addition, terms such as "first" and "second" in this application are merely used for distinction and description, and cannot be understood as an indication or implication of relative importance or an implicit indication of a quantity of indicated technical features, or an indication or implication of a sequence.

"Couplings" in this application are indirect couplings or communication connections between apparatuses, units, or modules, and may be electrical, mechanical, or in another form, and are used for information exchange between the apparatuses, the units, and the modules. In addition, the term "electrical connection" should be understood in a broad sense. For example, the "electrical connection" may be a physically direct connection, or may be an electrical connection through an intermediate medium, for example, a connection implemented through a resistor, an inductor, or another electronic device.

The following describes, with reference to the accompanying drawings, an electronic device that can implement multi-band matching of an antenna and that has an ultra-high relative bandwidth in an embodiment of this application.

It may be understood that the electronic device in this embodiment of this application may also be referred to as user equipment (User Equipment, UE), a mobile station (Mobile Station, MS), a mobile terminal (Mobile Terminal), or the like. Optionally, the electronic device may have a capability of communicating with one or more core networks through a radio access network (Radio Access Network, RAN). For example, the electronic device may be a device such as a mobile phone (or referred to as a "cellular" phone), a tablet computer, a palmtop computer, a notebook computer, or a desktop computer. A specific form of the electronic device is not specially limited in the following embodiments, and only a mobile phone is used as an example to describe how the electronic device implements a specific technical solution in embodiments.

FIG. 1 shows a schematic diagram of a hardware structure of an electronic device 100 according to an embodiment of this application. As shown in FIG. 1, the electronic device 100 may include a processor 110, an internal memory 121, an external memory interface 122, a camera 130, a display 140, a sensor module 150, an audio module 160, a speaker 161, a receiver 162, a microphone 163, a headset jack 164, a subscriber identification module (subscriber identification module, SIM) card interface 171, a universal serial bus (universal serial bus, USB) port 172, a charging management module 180, a power management module 181, a battery 182, an antenna 190, a radio frequency front-end circuit 191, and a radio frequency transceiver 192.

Certainly, in this embodiment of this application, the electronic device may further include a motor, an indicator, a button, and the like. It should be understood that the hardware structure shown in FIG. 1 is merely an example. The electronic device in this embodiment of this application may have more or fewer components than the electronic device shown in the figure, may combine two or more components, or may have different component configurations. The components shown in the figure may be implemented in hardware, software, or a combination of hardware and software including one or more signal processing and/or application-specific integrated circuits. The following describes the components of the electronic device in detail with reference to FIG. 1.

The processor 110 may include one or more processing units. For example, the processor 110 may include an application processor (application processor, AP), a baseband processor, a modem processor, a graphics processing unit (graphics processing unit, GPU), an image signal processor (image signal processor, ISP), a controller, a memory, a video codec, a digital signal processor (digital signal processor, DSP), a neural-network processing unit (Neural-network Processing Unit, NPU), and/or the like. Different processing units may be independent devices, or may be integrated into one or more processors. For example, the application processor may be configured to establish data transmission between the electronic device 100 and an external device. The external device may be, but is not limited to, an external memory card, a touchscreen, a camera, a USB port, a keyboard, a liquid crystal display (Liquid Crystal Display, LCD), a NAND (not and, NAND) flash memory, a synchronous dynamic random access memory (Synchronous Dynamic Random Access Memory, SDRAM), or the like. For another example, the baseband processor is configured to encode or decode a radio signal, and is connected to the radio frequency transceiver 192.

In some embodiments, a buffer may be further disposed in the processor 110, to store instructions and/or data. For example, the buffer in the processor 110 may be a cache. The buffer may be configured to store instructions and/or data that are just used, generated, or recycled by the processor 110. If the processor 110 needs to use the instructions or the data again, the processor 110 may directly invoke the instructions or the data from the buffer. This helps reduce time for the processor 110 to obtain the instructions or the data, and helps improve system efficiency.

The internal memory 121 may be configured to store a program and/or data. In some embodiments, the internal memory 121 includes a program storage region and a data storage region. The program storage region may be configured to store an operating system (for example, an operating system such as Android or iOS), a computer program (such as a facial recognition function and a voice play function) needed by at least one function, and the like. The data storage region may be configured to store data (such as audio data, or a facial image) created and/or collected in a process of using the electronic device. For example, the processor 110 may invoke the program and/or the data stored in the internal memory 121, to enable the electronic device to perform a corresponding method, implementing one or more functions. For example, the processor 110 invokes some programs and/or data in the internal memory, to enable the electronic device to perform the unlocking method provided in embodiments of this application, and to enable the user to quickly and conveniently unlock the electronic device to enter the guest mode. The internal memory 121 may be a high-speed random access memory, a nonvolatile memory, and/or the like. For example, the nonvolatile memory may include at least one of one or more magnetic disk storage devices, a flash memory device, and/or a universal flash storage (universal flash storage, UFS).

The external memory interface 122 may be configured to connect to an external memory card (for example, a micro SD card), to extend a storage capability of the electronic device. The external memory card communicates with the processor 110 through the external memory interface 122, to implement a data storage function. For example, the electronic device 100 may store files such as images, music, and videos in the external memory card through the external memory interface 122.

The camera 130 may be configured to capture or collect a moving image, a static image, or the like. Usually, the camera 130 includes a lens and an image sensor. An object is projected onto the image sensor by using an optical image generated by the lens, and then the object is converted into an electrical signal for subsequent processing. For example, the image sensor may be a charge-coupled device (charge-coupled device, CCD) or a complementary metal-oxide-semiconductor (complementary metal-oxide-semiconductor, CMOS) photoelectric transistor. The image sensor converts an optical signal into an electrical signal, and then transmits the electrical signal to the ISP for conversion into a digital image signal.

It may be understood that the electronic device 100 implements a display function by using the GPU, the display 140, the application processor, and the like. The GPU is a microprocessor for image processing, and is connected to the display 140 and the application processor. The GPU is configured to: perform mathematical and geometric computation, and render an image. The processor 110 may include one or more GPUs that execute program instructions to generate or change display information.

The display 140 is configured to display an image, a video, or the like. The display 140 includes a display panel. The display panel may be a liquid crystal display (liquid crystal display, LCD), an organic light-emitting diode (organic light-emitting diode, OLED), an active-matrix organic light-emitting diode (active-matrix organic light-emitting diode, AMOLED), a flexible light-emitting diode (flexible light-emitting diode, FLED), a mini-LED, a micro-LED, a micro-OLED, a quantum dot light-emitting diode (quantum dot light-emitting diode, QLED), or the like.

The sensor module 150 may include one or more sensors, for example, a touch sensor, a pressure sensor, a distance sensor, an acceleration sensor, a gyroscope, a fingerprint sensor, an ambient light sensor, an optical proximity sensor, a bone conduction sensor, a temperature sensor, an infrared lattice transmitter, a floodlight lighting element, and a time of flight (time of flight, TOF) distance sensor, and the like. This is not specifically limited in this embodiment of this application.

The electronic device 100 may implement an audio function, for example, an audio play function, a recording function, a voice wakeup function, or the like, through the audio module 160, the speaker 161, the receiver 162, the microphone 163, the headset jack 164, the application processor.

The audio module 160 may be configured to convert digital audio information into an analog audio signal for output, and is further configured to convert an analog audio input into a digital audio signal. The audio module 160 may be further configured to encode and decode an audio signal. For example, the audio module 160 may be disposed in the processor 110, or some functional modules of the audio module 160 are disposed in the processor 110.

The speaker 161, also referred to as a "loudspeaker", is configured to convert an audio electrical signal into a sound signal. For example, the electronic device 100 may be configured to: listen to music, answer a call in a hands-free mode, or give voice prompt light by using the speaker 161.

The receiver 162, also referred to as an "earpiece", is configured to convert an audio electrical signal into a sound signal. For example, when the electronic device 100 is used to answer a call or a voice message, the receiver 162 may be placed close to a human ear to answer the call or the voice message.

The microphone 163, also referred to as a "mike" or "mic", is configured to: collect a sound (for example, an ambient sound, including a sound made by a person, a sound made by a device, or the like), and convert the sound into audio electrical data. When making a call or sending a voice message, the user may make a sound by making a mouth of the user close to the microphone 163, and the microphone 163 collects the sound made by the user.

The headset jack 164 is configured to connect to a wired headset. The headset jack 164 may be a USB port 172, or may be a 3.5 mm open mobile terminal platform (open mobile terminal platform, OMTP) standard interface, a cellular telecommunications industry association of the USA (cellular telecommunications industry association of the USA, CTIA) standard interface, or the like.

The SIM card interface 171 is configured to connect to a SIM card. The SIM card may be inserted into the SIM card interface 171 or removed from the SIM card interface 171, to implement contact with or separation from the electronic device 100. The electronic device 100 may support one SIM card interface or N SIM card interfaces, where N is a positive integer greater than 1. The SIM card interface 171 may support a nano-SIM card, a micro-SIM card, a SIM card, and/or the like. A plurality of cards may be inserted into a same SIM card interface 171 at the same time. The plurality of cards may be of a same type or of different types. The SIM card interface 171 may be further compatible with different types of SIM cards. The SIM card interface 171 may be further compatible with an external memory card. The electronic device 100 interacts with a network through the SIM card, to implement functions such as a call and data communication. In some embodiments, the electronic device 100 may alternatively be an eSIM, that is, an embedded SIM card. The eSIM card may be embedded in the electronic device 100, and cannot be separated from the electronic device 100.

The USB port 172 is an interface that conforms to a USB standard specification, and may be specifically a mini USB port, a micro USB port, a USB type-C port, or the like. For example, the USB port 172 may be configured to connect to a charger to charge the electronic device 100, or may be configured to connect the electronic device 100 to a headset to play audio by using the headset. When the USB port 172 may be connected to a headset, it may be understood that the USB port 172 is used as a headset jack. For example, in addition to the headset jack, the USB port 172 may further be configured to connect to another electronic device, for example, an AR device, a computer, or the like.

The charging management module 180 is configured to receive a charging input from the charger. The charger may be a wireless charger or a wired charger. In some embodiments of wired charging, the charging management module 180 may receive a charging input from the wired charger through the USB port 172. In some embodiments of wireless charging, the charging management module 180 may receive a wireless charging input through a wireless charging coil of the electronic device 100. When charging the battery 182, the charging management module 180 may further charge the electronic device 100 through the power management module 181.

The power management module 181 is configured to connect to the battery 182, the charging management module 180, and the processor 110. The power management module 181 receives an input from the battery 182 and/or the charging management module 180, and supplies power to the processor 110, the internal memory 121, the camera 130, the display 140, and the like. The power management module 181 may be further configured to monitor a parameter such as a battery capacity, a battery cycle count, or a battery health status (electric leakage or impedance). In some other embodiments, the power management module 181 may alternatively be disposed in the processor 110. In still some other embodiments, the power management module 181 and the charging management module 180 may alternatively be disposed in a same device.

A communication function of the electronic device 100 may be implemented through the antenna 190, the radio frequency front-end circuit 191, the radio frequency transceiver 192, or the like. The antenna 190 is configured to transmit and receive an electromagnetic wave signal. For example, the antenna 190 is configured to: transmit an uplink signal sent by the radio frequency transceiver 192 to the outside, or receive a downlink signal from the outside, and send the received downlink signal to the radio frequency transceiver 192. The antenna 190 may be an antenna element that simultaneously receives and transmits signals of a plurality of frequency bands, or a combination of a plurality of antenna elements that respectively receive and transmit signals of different frequency bands. This is not specifically limited herein in this application.

The radio frequency front-end circuit 191 is configured to: extract a useful radio frequency signal in a space signal received by the antenna 190 completely and without distortion, and transmit an extracted signal to a next-stage down conversion circuit (for example, the radio frequency transceiver 192); or amplify a signal converted by an up conversion circuit (for example, the radio frequency transceiver 192) and then transmit an amplified signal through the antenna 190, to enable the electronic device 100 to complete communication with a network device (for example, a server, a base station, or the like) or another electronic device (for example, a smartphone or the like), for example, information sending and receiving.

Figure 2:
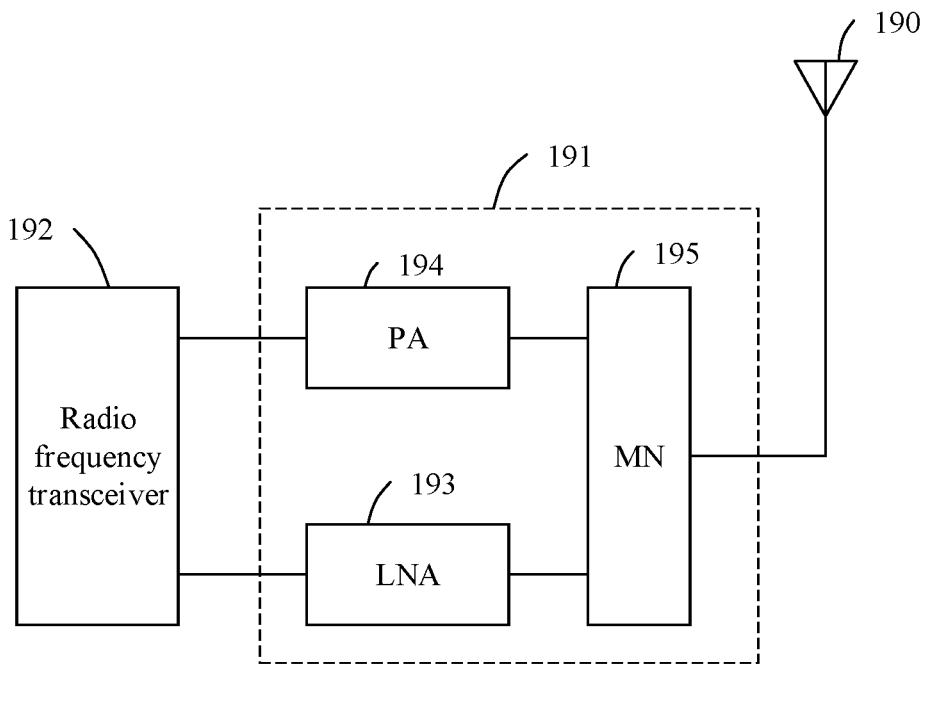
FIG. 2 is a schematic diagram of a radio frequency front-end circuit, a radio frequency transceiver, and an antenna according to an embodiment of this application.

Refer to FIG. 2 together. The radio frequency front-end circuit 191 includes at least a low noise amplifier (low noise amplifier, LNA) 193, a power amplifier (power amplifier, PA) 194, and a matching network (matching network, MN) 195. One end of the LNA 193 is coupled to the MN 195, so that the LNA 193 is coupled to the antenna 190 through the MN 195. The other end of the LNA 193 is coupled to the radio frequency transceiver 192. The LNA 193 is configured to amplify a weak signal to reduce noise in a downlink signal.

One end of the PA 194 is coupled to the radio frequency transceiver 192, and the other end is coupled to the MN 195, so that the PA 194 is coupled to the antenna 190 through the MN 195. The PA 194 is configured to amplify the uplink signal transmitted by the radio frequency transceiver 192, then the uplink signal is matched and tuned by using the MN 195, and then the uplink signal is transmitted through the antenna 190.

In this embodiment of this application, the antenna 190, the MN 195, the LNA 193, and the radio frequency transceiver 192 may form a radio frequency signal receiver (receiver). The radio frequency transceiver 192, the PA 194, the MN 195, and the antenna 190 may form a radio frequency signal transmitter (transmitter). Certainly, in another embodiment, the radio frequency front-end circuit 191 may further include a power amplifier device such as a variable gain amplifier (variable gain amplifier, VGA), or may further include devices such as a filter, a phase shifter, and a frequency mixer (mixer). This is not specifically limited in this application.

Refer to FIG. 1 and FIG. 2 again. The radio frequency transceiver 192 may include a modem processor and a baseband processor, and is configured to receive and transmit a radio signal of each frequency band. For example, the electronic device 100 may receive an electromagnetic wave through the antenna 190, and transmit, by using the radio frequency front-end circuit 191, the electromagnetic wave to the modem processor for demodulation. In addition, the electronic device 100 further processes (for example, modulates) a signal by using the radio frequency transceiver 192, then the signal is transmitted to the antenna 190 by using the radio frequency front-end circuit 191, and finally the signal is converted into an electromagnetic wave through the antenna 190 for radiation.

The modem processor may include a modulator and a demodulator. The modulator is configured to modulate a low-frequency baseband signal to be transmitted into a medium-high-frequency signal. The demodulator is configured to demodulate a received electromagnetic wave signal into a low-frequency baseband signal. Then the demodulator transmits the low-frequency baseband signal obtained through demodulation to the baseband processor for processing. After being processed by the baseband processor, the low-frequency baseband signal is transferred to the application processor (for example, the processor 110). The application processor outputs a sound signal through an audio device (which is not limited to the speaker 161, the receiver 162, or the like), or displays an image or a video through the display 140.

In some embodiments, the modem processor may be an independent device. In some other embodiments, the modem processor may be independent of the processor 110, and is disposed in a same device as another functional module.

In some embodiments, at least some functional modules of the radio frequency front-end circuit 191 and the radio frequency transceiver 192 may be disposed in the processor 110. In some other embodiments, at least some functional modules of the radio frequency front-end circuit 191 and the radio frequency transceiver 192 may be disposed in a same device as at least some modules of the processor 110. For example, the modem processor and/or the baseband processor in the radio frequency transceiver 192 may be disposed in the processor 110. To be specific, some functions of the radio frequency transceiver 192 may be integrated with the processor 110. In this embodiment of this application, for ease of description, an example in which the radio frequency front-end circuit 191 and the radio frequency transceiver 192 are independent of the processor 110 is used for description.

Figure 3:
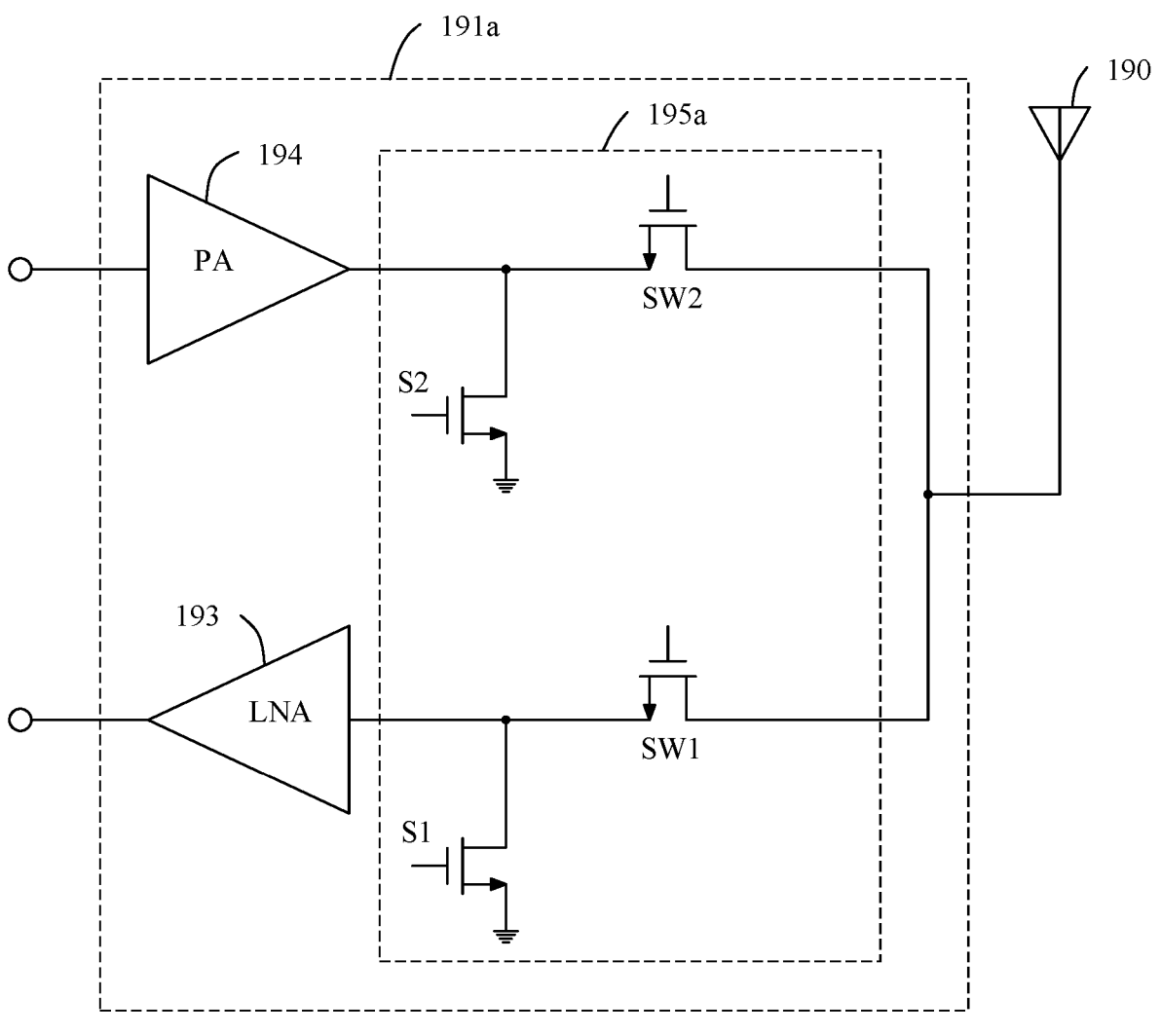
FIG. 3 is a schematic diagram of a circuit of a radio frequency front-end circuit and an antenna according to Embodiment 1 of this application.

FIG. 3 is a schematic diagram of a circuit of a radio frequency front-end circuit 191*a* and an antenna 190 according to Embodiment 1 of this application. As shown in FIG. 3, in Embodiment 1, the radio frequency front-end circuit 191*a* includes an LNA 193, a PA 194, and an MN 195*a*. The MN 195*a* includes a first switching element SW1, a second switching element SW2, a first switch S1, and a second switch S2.

For example, as shown in FIG. 3, the first switching element SW1, the second switching element SW2, the first switch S1, and the second switch S2 may all be switching transistors, for example, negative channel-metal-oxide-semiconductor (negative channel-metal-oxide-semiconductor, NMOS) transistors. Certainly, in another embodiment of this application, the switching transistor is not limited to the NMOS transistor, and may alternatively be another type of switching transistor. This is not specifically limited herein. In the following embodiments, for ease of description, an example in which the switching transistor is an NMOS transistor is used for description.

In Embodiment 1, an input end of the LNA 193 is electrically connected to the antenna 190 through the first switching element SW1 that is connected in series to the LNA 193, and an output end of the LNA 193 is configured to output a receive (Receiver, Rx) signal to the radio frequency transceiver 192. The input end of the LNA 193 is further grounded through the first switch S1.

An input end of the PA 194 is configured to receive a transmit (Transmitter, Tx) signal from the radio frequency transceiver 192, and an output end of the PA 194 is electrically connected to the antenna 190 through the second switching element SW2 that is connected in series to the PA 194. The output end of the PA 194 is further grounded through the second switch S2.

In Embodiment 1, when the first switching element SW1 is powered on and conducted, and the second switching element SW2 is powered off and cut off, the LNA 193 may receive, by using the conducted first switching element SW1, a downlink signal (for example, the Rx signal) received by the antenna 190, amplify the downlink signal, and output an amplified downlink signal to the radio frequency transceiver 192. When the first switching element SW1 is powered off and cut off and the second switching element SW2 is powered on and conducted, the PA 194 may receive an uplink signal (for example, the Tx signal) sent by the radio frequency transceiver 192, amplify the uplink signal, and transmit an amplified uplink signal by using the conducted second switching element SW2 and the antenna 190.

The first switching element SW1, the second switching element SW2, the first switch S1, and the second switch S2 in the MN 195*a* are all switching transistors, and are connected in series and parallel to each other. For example, the first switching element SW1 and the first switch S1 are connected in series between the antenna 190 and the ground. The second switching element SW2 and the second switch S2 are also connected in series between the antenna 190 and the ground. In this way, the first switching element SW1 and the first switch S1 that are connected in series and the second switching element SW2 and the second switch S2 that are connected in series are connected in parallel between the antenna 190 and the ground. Therefore, the MN 195*a* also forms a switch circuit. In Embodiment 1, the switch circuit uses NMOS transistors connected in series and parallel, and is set as an independent circuit whose port impedance is 50 ohms (ohms). Port impedance of the LNA 193 and port impedance of the PA 194 are also 50 ohms (ohms), and each of the LNA 193 and the PA 194 is disposed independently of the MN 195*a* and is coupled to the MN 195*a*. In other words, the switch circuit is not used as a part of a circuit of the LNA 193 and/or the PA 194, but is disposed independently of the LNA 193 and the PA 194, that is, the switch circuit is not co-designed with the LNA 193 and/or the PA 194.

Figure 4:
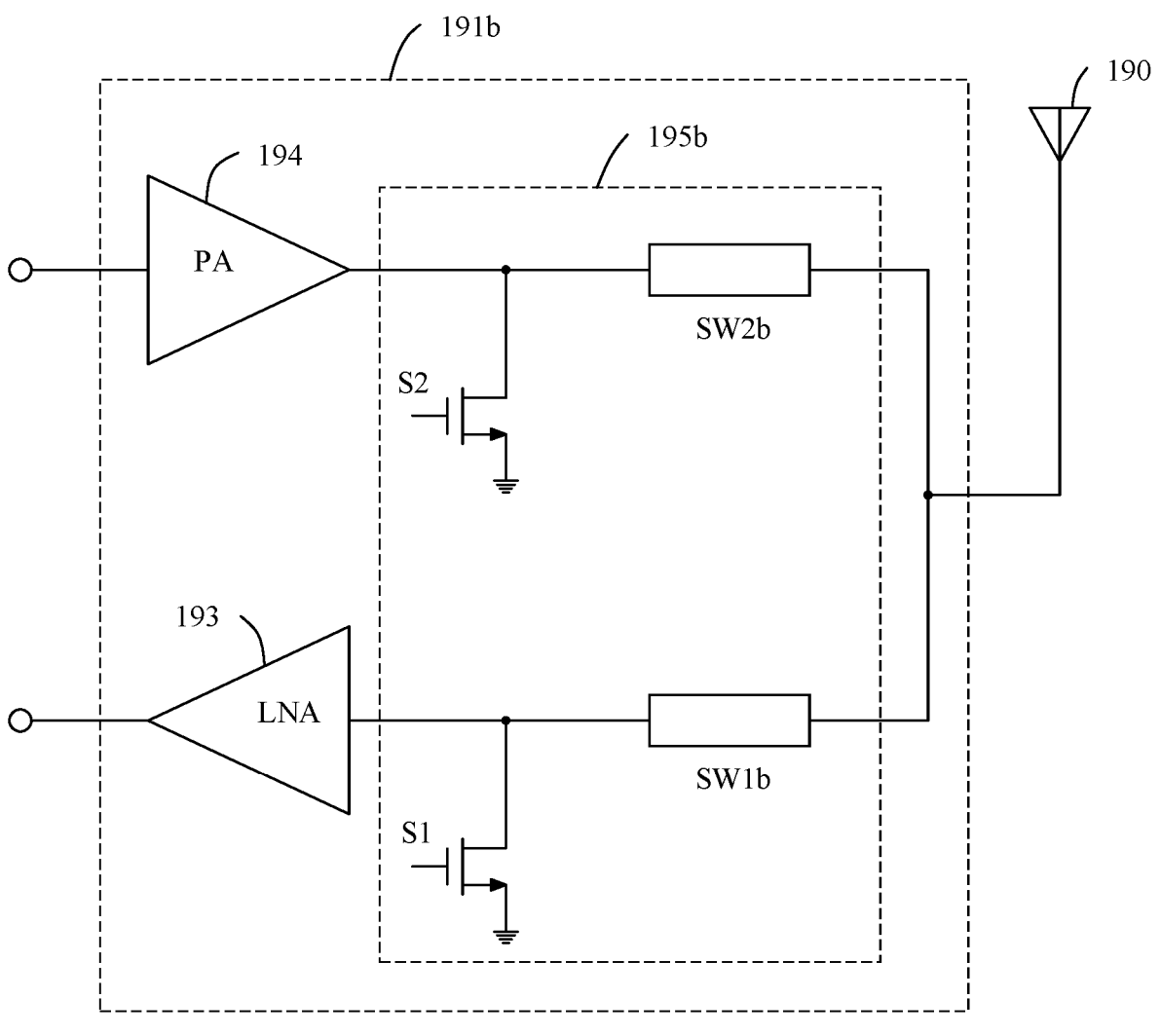
FIG. 4 is a schematic diagram of a circuit of a radio frequency front-end circuit and an antenna according to Embodiment 2 of this application.

FIG. 4 is a schematic diagram of a circuit of a radio frequency front-end circuit 191*b* and an antenna 190 according to Embodiment 2 of this application. As shown in FIG. 4, the radio frequency front-end circuit 191*b* includes an LNA 193, a PA 194, and an MN 195*b*. The MN 195*b* includes a first switching element SW1*b*, a second switching element SW2*b*, a first switch S1, and a second switch S2. Both the first switching element SW1*b* and the second switching element SW2*b* are quarter-wavelength transmission lines.

It is clear that, as shown in FIG. 4, a circuit structure of the MN 195*b* in Embodiment 2 is similar to a circuit structure of the MN 195*a* in Embodiment 1, and a difference lies in that the first switching element SW1 and the second switching element SW2 in Embodiment 1 are both switching transistors, while for the first switching element SW1*b* and the second switching element SW2*b* in Embodiment 2, the switching transistors are replaced with transmission lines. In this way, in Embodiment 2, the corresponding switching transistors are replaced with the quarter-wavelength transmission lines, to effectively reduce an insertion loss (insertion loss, IL) of the radio frequency front-end circuit 191*b*.

Figure 5:
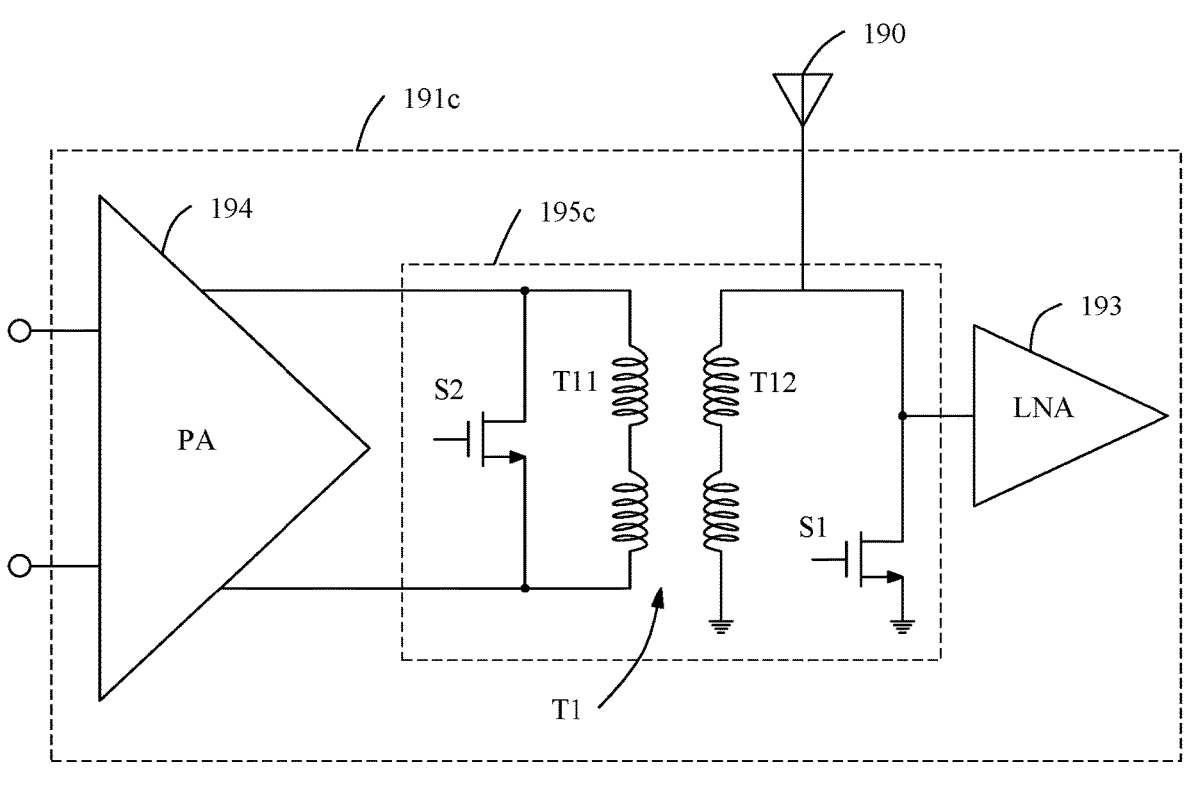
FIG. 5 is a schematic diagram of a circuit of a radio frequency front-end circuit and an antenna according to Embodiment 3 of this application.

FIG. 5 is a schematic diagram of a circuit of a radio frequency front-end circuit 191*c* and an antenna 190 according to Embodiment 3 of this application. As shown in FIG. 5, the radio frequency front-end circuit 191*c* includes an LNA 193, a PA 194, and an MN 195*c*. The MN 195*c* includes a transformer T1, a first switch S1, and a second switch S2. One end of a secondary coil T12 of the transformer T1 is coupled to input ends of the antenna 190 and the LNA 193. The other end of the secondary coil T12 of the transformer T1 is grounded. The input end of the LNA 193 is further grounded through the first switch S1. To be specific, the secondary coil T12 of the transformer T1 is connected in parallel to the input end of the LNA 193. A primary coil T11 of the transformer T1 and the second switch S2 are connected in parallel to an output end of the PA 194.

It is clear that, as shown in FIG. 5, the MN 195*c* in Embodiment 3 uses the transformer T1 and replaces corresponding switching elements (for example, switching transistors) with the primary coil and the secondary coil of the transformer T1. For example, the secondary coil T12 of the transformer T1 forms a first switching element, and the primary coil T11 of the transformer T1 forms a second switching element. In this way, compared with the MN 195*b* in Embodiment 2, the radio frequency front-end circuit 191*c* in Embodiment 3 may effectively reduce an area of a transmission line, effectively reducing an area of a chip.

Figure 6:
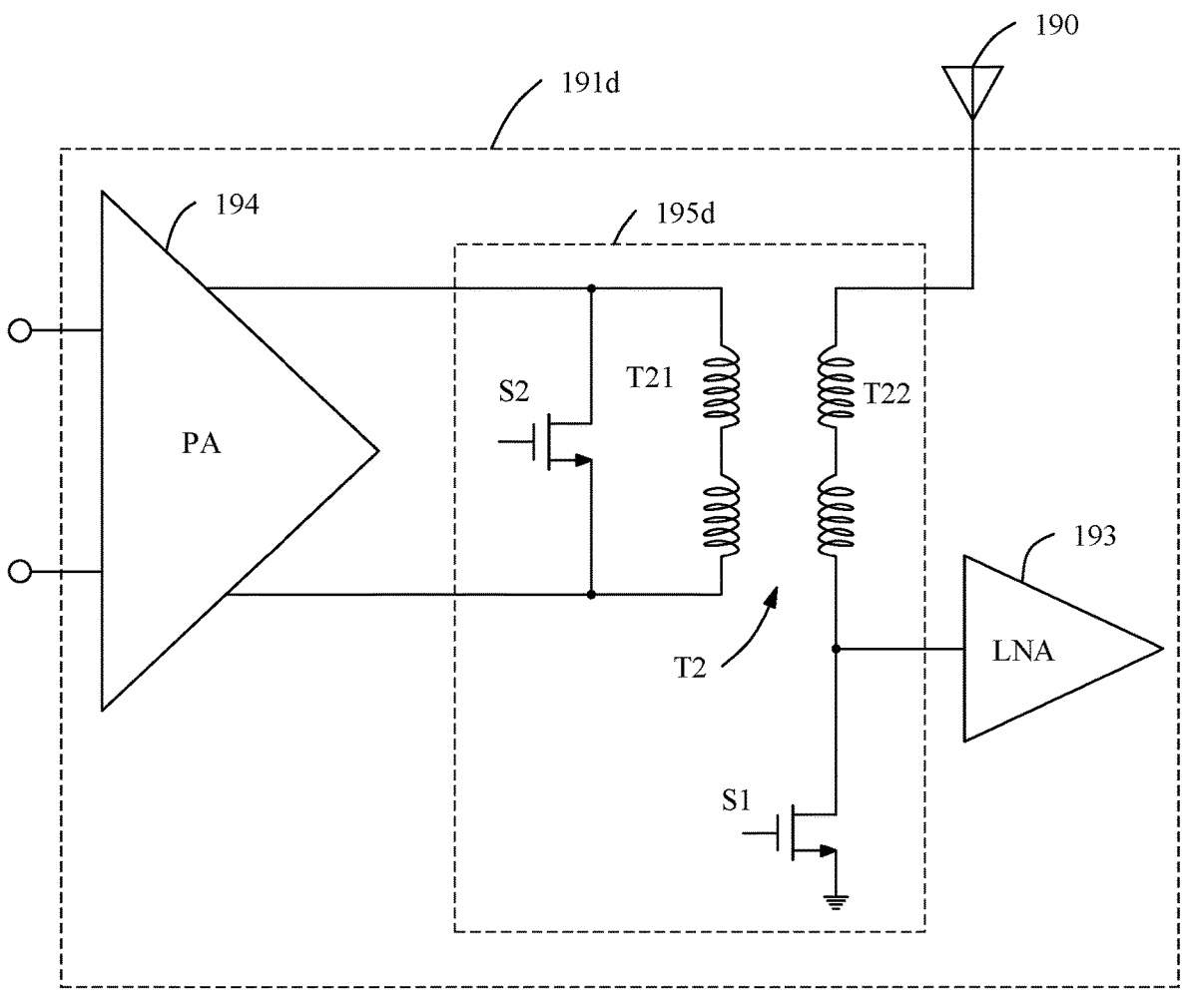
FIG. 6 is a schematic diagram of a circuit of a radio frequency front-end circuit and an antenna according to Embodiment 4 of this application.

FIG. 6 is a schematic diagram of a circuit of a radio frequency front-end circuit 191*d* and an antenna 190 according to Embodiment 4 of this application. As shown in FIG. 6, the radio frequency front-end circuit 191*d* includes an LNA 193, a PA 194, and an MN 195*d*. The MN 195*d* includes a transformer T2, a first switch S1, and a second switch S2. Refer to FIG. 5 and FIG. 6. It is clear that, a circuit structure of the MN 195*d* in Embodiment 4 is similar to a circuit structure of the MN 195*c* in Embodiment 3, and a difference lies in that a secondary coil T22 of the transformer T2 is connected in series to the input end of the LNA 193. Specifically, one end of the secondary coil T22 of the transformer T2 is coupled to the antenna 190. The other end of the secondary coil T22 of the transformer T2 is coupled to the input end of the LNA 193 and one end of the first switch S1. The other end of the first switch S1 is grounded.

Similar to Embodiment 3, the radio frequency front-end circuit 191*d* in Embodiment 4 uses the transformer T2 and may reduce an area of a transmission line, effectively reducing an area of a chip. In addition, the secondary coil T22 of the transformer T2 is connected in series to the input end of the LNA 193, and may be used as a part of a circuit for input matching of the LNA 193, that is, the secondary coil T22 of the transformer T2 is co-designed with the LNA 193, to further optimize a noise figure of the LNA 193 and output power of the PA 194. In other words, impact of a switch on a transmit end and a receive end may be effectively reduced.

Figure 7:
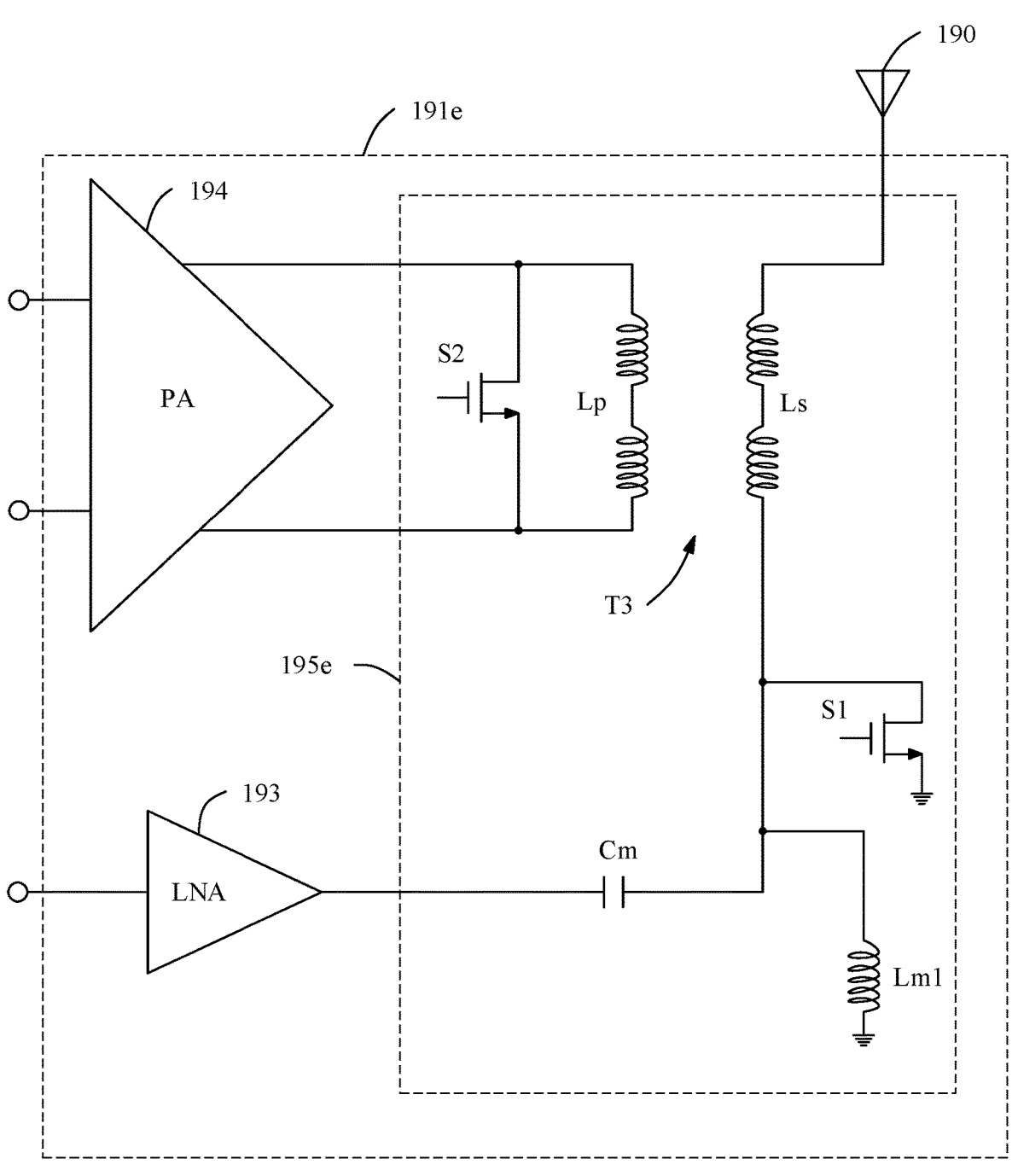
FIG. 7 is a schematic diagram of a circuit of a radio frequency front-end circuit and an antenna according to Embodiment 5 of this application.

FIG. 7 is a schematic diagram of a circuit of a radio frequency front-end circuit 191*e* and an antenna 190 according to Embodiment 5 of this application. As shown in FIG. 7, the radio frequency front-end circuit 191*e* includes an LNA 193, a PA 194, and an MN 195*e*. The MN 195*e* includes a transformer T3, a first switch S1, a second switch S2, a first inductor Lm1, and a capacitor Cm.

One end of a secondary coil Ls of the transformer T3 is coupled to the antenna 190, and the other end is grounded through the first switch S1. To be specific, the secondary coil Ls of the transformer T3 and the first switch S1 are connected in series between the antenna 190 and the ground. A primary coil Lp of the transformer T3 and the second switch S2 are connected in parallel to an output end of the PA 194. An input end of the PA 194 is configured to receive a differential transmit (Tx) signal.

One end of the first inductor Lm1 is electrically connected between the secondary coil Ls of the transformer T3 and the first switch S1. The other end of the first inductor Lm1 is grounded. In other words, the first inductor Lm1 and the first switch S1 are connected in parallel between the secondary coil Ls of the transformer T3 and the ground. The capacitor Cm is a direct-current blocking capacitor, and two ends of the capacitor Cm are connected between the secondary coil Ls of the transformer T3 and the LNA 193.

Figure 8:
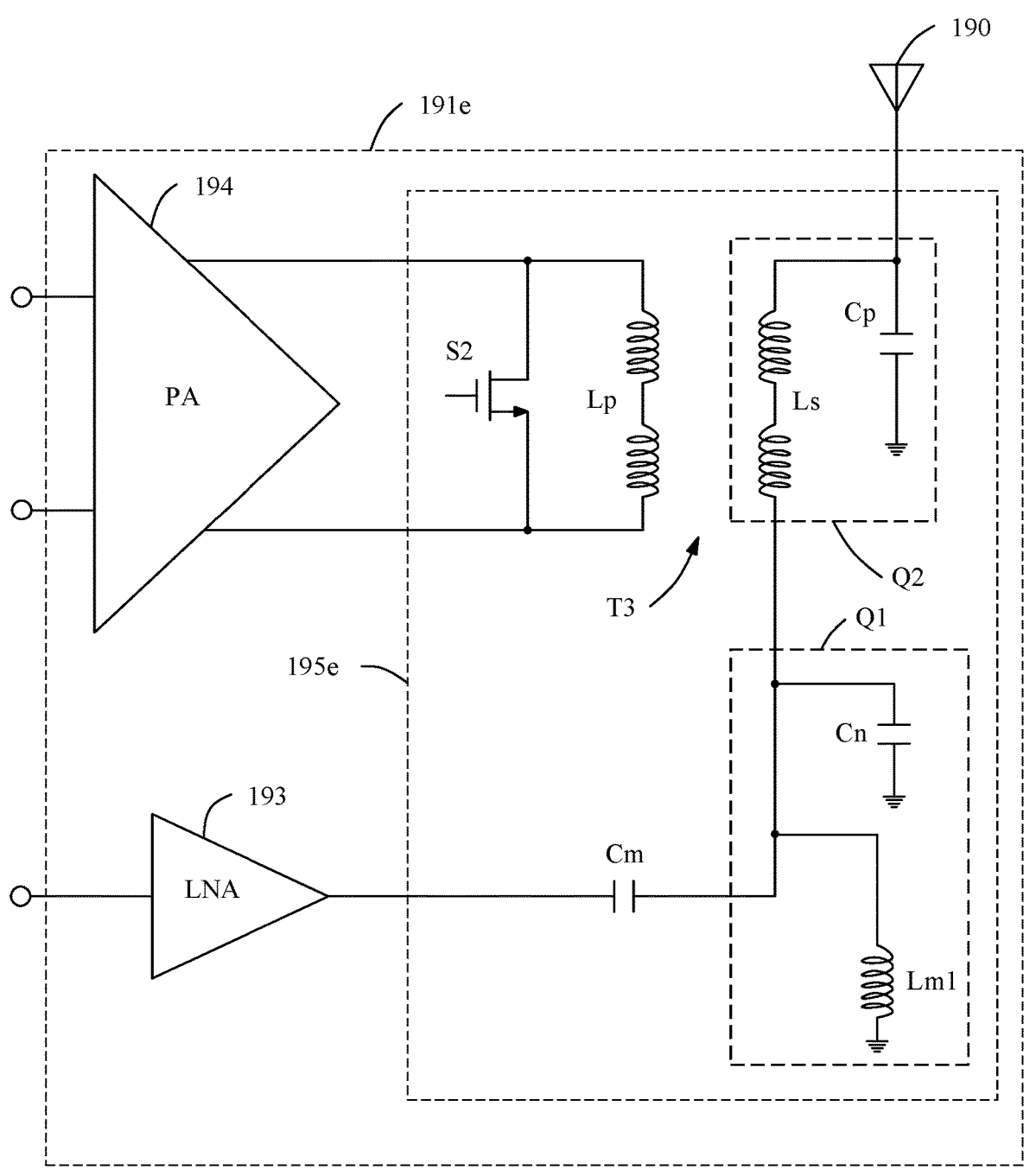
FIG. 8 is a diagram of an equivalent circuit of the radio frequency front-end circuit and the antenna shown in FIG. 7.

FIG. 8 is a diagram of an equivalent circuit of the radio frequency front-end circuit 191*e* and the antenna 190 shown in FIG. 7. A first equivalent capacitor Cn is a sum of a capacitance of the first switch S1 when being turned off (that is, cut off) and a parasitic capacitance of the secondary coil Ls. A second equivalent capacitor Cp is a sum of a parasitic capacitance of a pad (PAD) and a parasitic capacitance of the antenna 190. As shown in FIG. 8, the first equivalent capacitor Cn and the first inductor Lm1 form a resonant network Q1. The resonant network Q1 is configured to perform impedance matching or tuning on the radio frequency front-end circuit 191*e*, to enable the radio frequency front-end circuit 191*e* to include at least one resonance point in an operating frequency band, for example, generate a first resonance point. The secondary coil Ls and the second equivalent capacitor Cp form a resonant network Q2. The resonant network Q2 is configured to perform impedance matching or tuning on the radio frequency front-end circuit 191*e*, to enable the radio frequency front-end circuit 191*e* to include at least one resonance point in the operating frequency band, for example, generate a second resonance point.

Figure 9:
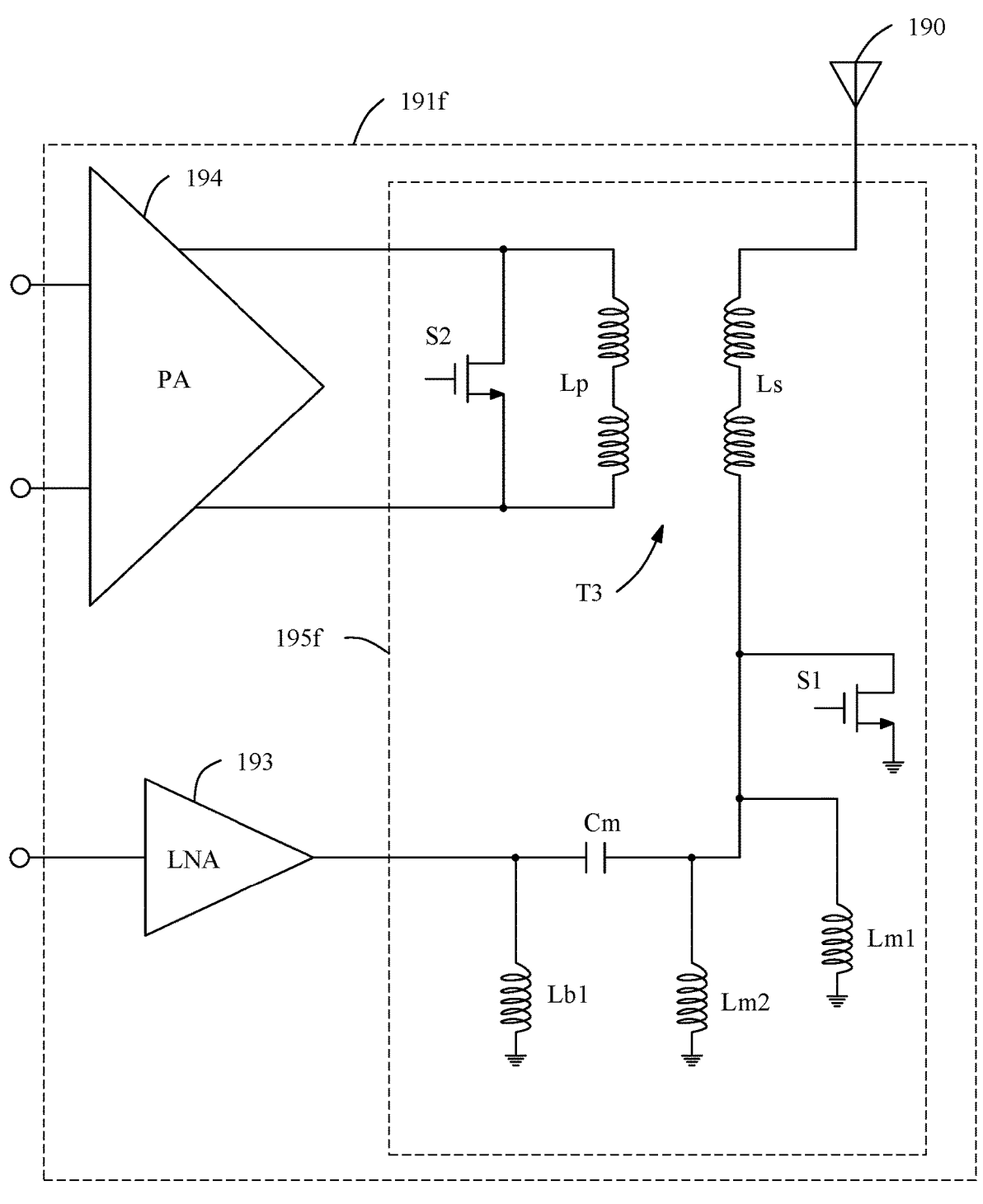
FIG. 9 is a schematic diagram of a circuit of a radio frequency front-end circuit and an antenna according to Embodiment 6 of this application.

FIG. 9 is a schematic diagram of a circuit of a radio frequency front-end circuit 191*f* and an antenna 190 according to Embodiment 6 of this application. As shown in FIG. 9, the radio frequency front-end circuit 191*f* includes an LNA 193, a PA 194, and an MN 195*f*. The MN 195*f* includes a transformer T3, a first switch S1, a second switch S2, a first inductor Lm1, and a capacitor Cm. It is clear that, a circuit structure of the radio frequency front-end circuit 191*f* shown in Embodiment 6 is similar to a circuit structure of the radio frequency front-end circuit 191*e* in Embodiment 5, and a difference lies in that the MN 195*f* in Embodiment 6 further includes a second inductor Lm2 and a third inductor Lb1. One end of the second inductor Lm2 is electrically connected between the capacitor Cm and a secondary coil Ls, and the other end is grounded. That is, the second inductor Lm2, the first inductor Lm1, and the first switch S1 are connected in parallel to each other. One end of the third inductor Lb1 is electrically connected between the capacitor Cm and the LNA 193, and the other end is grounded. That is, the third inductor Lb1 and the second inductor Lm2 are connected in parallel to two ends of the capacitor Cm.

Figure 10:
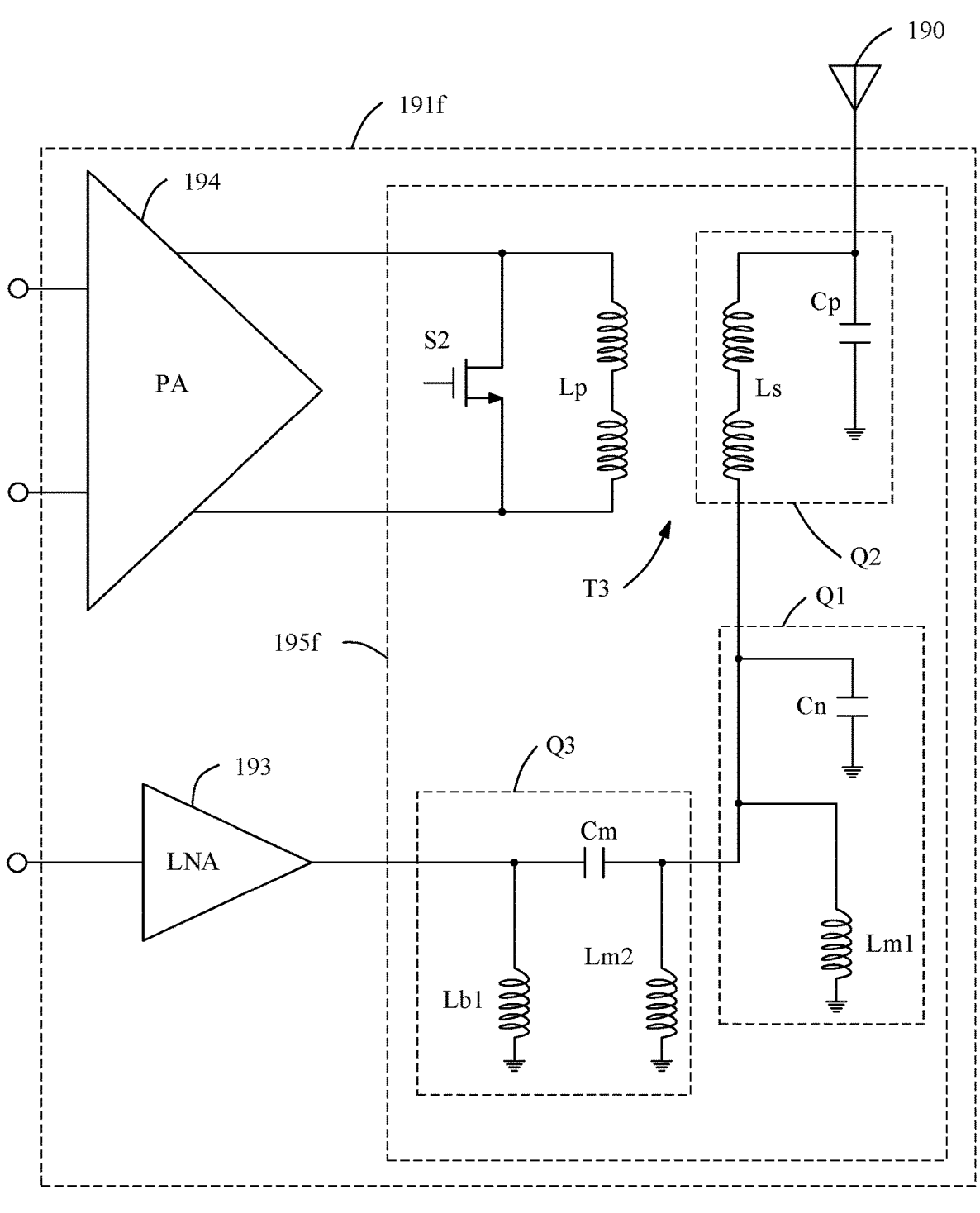
FIG. 10 is a diagram of an equivalent circuit of the radio frequency front-end circuit and the antenna shown in FIG. 9.

FIG. 10 is a diagram of an equivalent circuit of the radio frequency front-end circuit 191*f* and the antenna 190 shown in FIG. 9. A first equivalent capacitor Cn is a sum of a capacitance of the first switch S1 when being turned off (that is, cut off) and a parasitic capacitance of the secondary coil Ls. A second equivalent capacitor Cp is a sum of a parasitic capacitance of a pad (PAD) and a parasitic capacitance of the antenna 190. Similar to the MN 195*e* shown in FIG. 8, the first equivalent capacitor Cn and the first inductor Lm1 form a resonant network Q1, to generate a first resonance point. The secondary coil Ls and the second equivalent capacitor Cp form a resonant network Q2, to generate a second resonance point. In addition, as shown in FIG. 10, because the MN 195*f* includes the second inductor Lm2 and the third inductor Lb1, the second inductor Lm2, the third inductor Lb1, and the capacitor Cm may form a resonant network Q3. The resonant network Q3 is configured to perform impedance matching or tuning on the radio frequency front-end circuit 191*f*, to enable the radio frequency front-end circuit 191*f* to include at least one resonance point in an operating frequency band, for example, generate a third resonance point.

It should be understood that, in some embodiments, the first inductor Lm1 and the second inductor Lm2 may be generated by a same inductor element.

Figure 11:
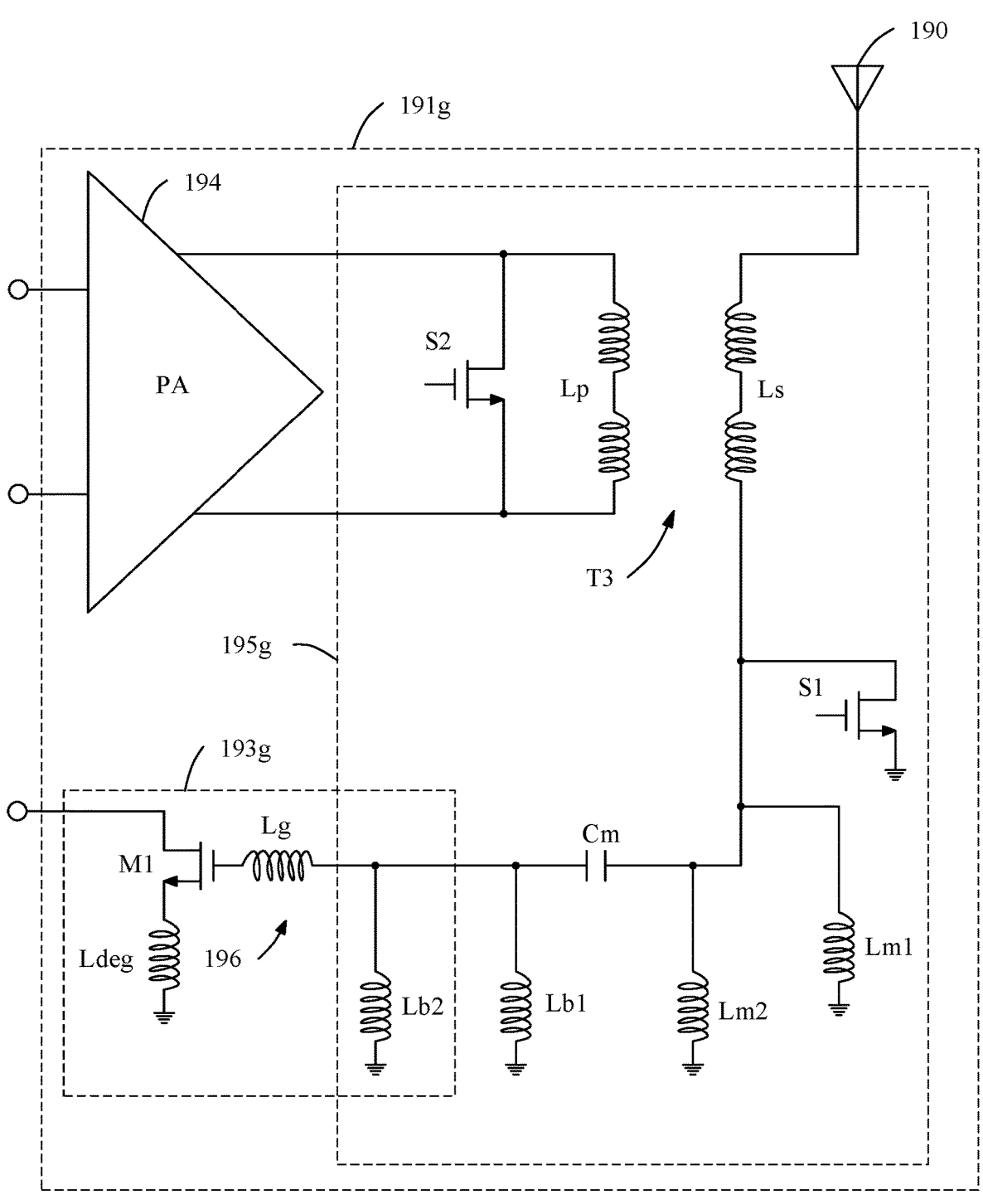
FIG. 11 is a schematic diagram of a circuit of a radio frequency front-end circuit and an antenna according to Embodiment 7 of this application.

FIG. 11 is a schematic diagram of a circuit of a radio frequency front-end circuit 191*g* and an antenna 190 according to Embodiment 7 of this application. As shown in FIG. 11, the radio frequency front-end circuit 191*g* includes an LNA 193*g*, a PA 194, and an MN 195*g*. The MN 195*g* includes a transformer T3, a first switch S1, a second switch S2, a first inductor Lm1, a capacitor Cm, a second inductor Lm2, and a third inductor Lb1. It is clear that, a circuit structure of the radio frequency front-end circuit 191*g* shown in Embodiment 7 is similar to a circuit structure of the radio frequency front-end circuit 191*f* in Embodiment 6, and a difference lies in that the MN 195*g* in Embodiment 7 further includes a fourth inductor Lb2, and the LNA 193*g* further includes a bias circuit 196.

Specifically, one end of the fourth inductor Lb2 is electrically connected between the capacitor Cm and the third inductor Lb1, and the other end is grounded. That is, the fourth inductor Lb2 and the third inductor Lb1 are connected in parallel. The bias circuit 196 includes a switching transistor M1, the fourth inductor Lb2, a fifth inductor Lg, and a sixth inductor Ldeg. One end of the fifth inductor Lg is electrically connected between the capacitor Cm and the fourth inductor Lb2. The other end of the fifth inductor Lg is electrically connected to a gate of the switching transistor M1. A source of the switching transistor M1 is grounded through the sixth inductor Ldeg. A drain of the switching transistor M1 is configured to output a radio frequency signal. In this embodiment of this application, the fifth inductor Lg is mainly configured to perform input matching on the LNA 193*g*, and the fourth inductor Lb2 is configured to cooperate with the fifth inductor Lg to implement broadband matching. The sixth inductor Ldeg is configured to generate a real part, to enable the input matching of the LNA 193*g* to become easier.

It should be understood that, in some embodiments, the fourth inductor Lb2 and the fifth inductor Lg are generated by a same inductor element.

Figure 12:
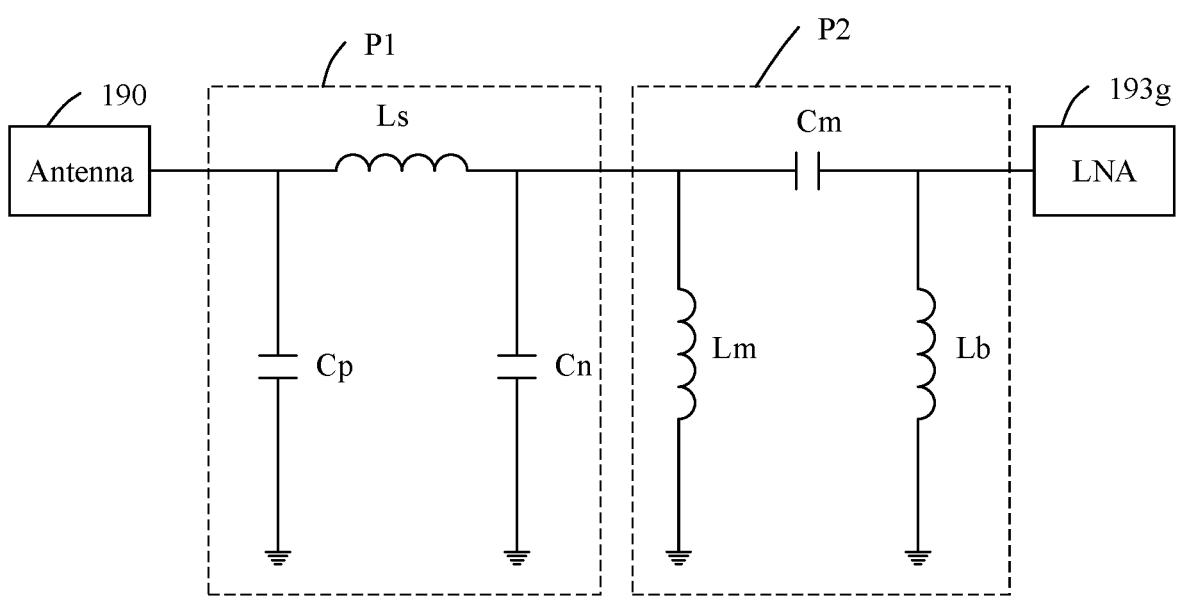
FIG. 12 is a diagram of a partial equivalent circuit of the radio frequency front-end circuit and the antenna shown in FIG. 11.

FIG. 12 is a diagram of an equivalent circuit of the radio frequency front-end circuit 191*g* and the antenna 190 shown in FIG. 11. A first equivalent capacitor Cn is a sum of a capacitance of the first switch S2 when being turned off (that is, cut off) and a parasitic capacitance of the secondary coil Ls. A second equivalent capacitor Cp is a sum of a parasitic capacitance of a pad (PAD) and a parasitic capacitance of the antenna 190. A first inductor element Lm is an equivalent inductor obtained after the first inductor Lm1 and the second inductor Lm2 are connected in parallel. A second inductor element Lb is an equivalent inductor obtained after the third inductor Lb1 and the fourth inductor Lb2 are connected in parallel. One end of the first equivalent capacitor Cn and one end of the second equivalent capacitor Cp are connected in parallel to two ends of the secondary coil Ls, and both the other end of the first equivalent capacitor Cn and the other end of the second equivalent capacitor Cp are grounded. The second equivalent capacitor Cp and the secondary coil Ls are further electrically connected to the antenna 190. One end of the first inductor element Lm and one end of the second inductor element Lb are connected in parallel to two ends of the capacitor Cm. Both the other end of the first inductor element Lm and the other end of the second inductor element Lb are grounded. The capacitor Cm and the second inductor element Lb are further electrically connected to the LNA 193*g*. To be specific, the secondary coil Ls and the capacitor Cm are connected in series between the antenna 190 and the LNA 193*g*.

Figure 13A:
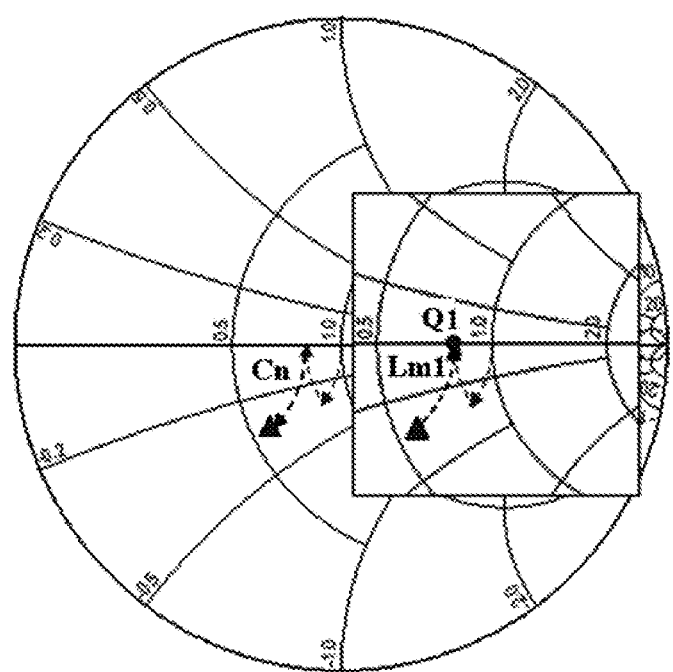
FIG. 13a to FIG. 13c are Smith charts of three resonance points generated in a matching network in the radio frequency front-end circuit shown in FIG. 10.
Figure 13B:
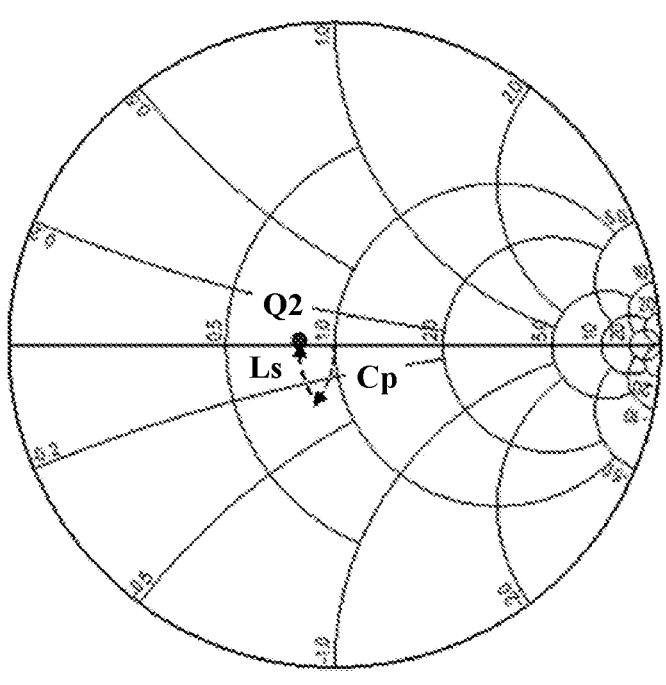
Figure 13C:
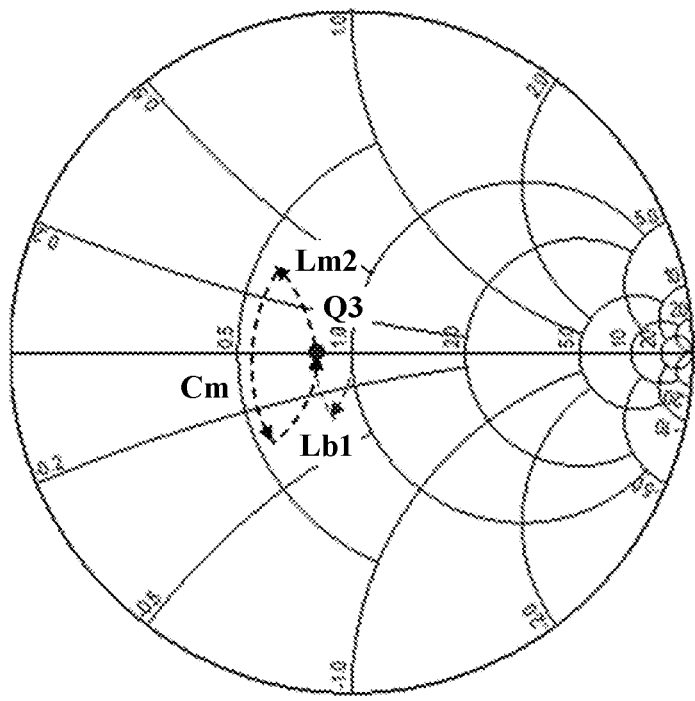

It is clear that, as shown in FIG. 11 and FIG. 12, the fourth inductor Lb2 forms a part of the bias circuit 196. In addition, refer to FIG. 10, FIG. 11, and FIG. 13*a* to FIG. 13*c* together. When an electronic device 100 operates, the first equivalent capacitor Cn and a first inductor component (that is, the first inductor Lm1) of the first inductor element Lm form a resonant network Q1, to generate a first resonance point (refer to FIG. 13*a*). The secondary coil Ls and the second equivalent capacitor Cp form a resonant network Q2, to generate a second resonance point (refer to FIG. 13*b*). A second inductor component (that is, the second inductor Lm2) of the first inductor element Lm, a first inductor component (that is, the third inductor Lb1) of the second inductor element Lb, and the capacitor Cm form a resonant network Q3, to generate a third resonance point (refer to FIG. 13*c*).

In this way, at least two resonant networks may be formed by disposing the secondary coil Ls, the first switch S1, the capacitor Cm, the first inductor Lm1, the second inductor Lm2, and the third inductor Lb1, effectively expanding a frequency bandwidth of the electronic device. Specifically, the first inductor element Lm and the second inductor element Lb may be disposed to form the three resonant networks Q1, Q2, and Q3 together with the secondary coil Ls, the capacitor Cm, and the first switch S1, and the three resonant networks converge at a point on each of Smith charts (refer to FIG. 13*a* to FIG. 13*c*).

Figure 14:
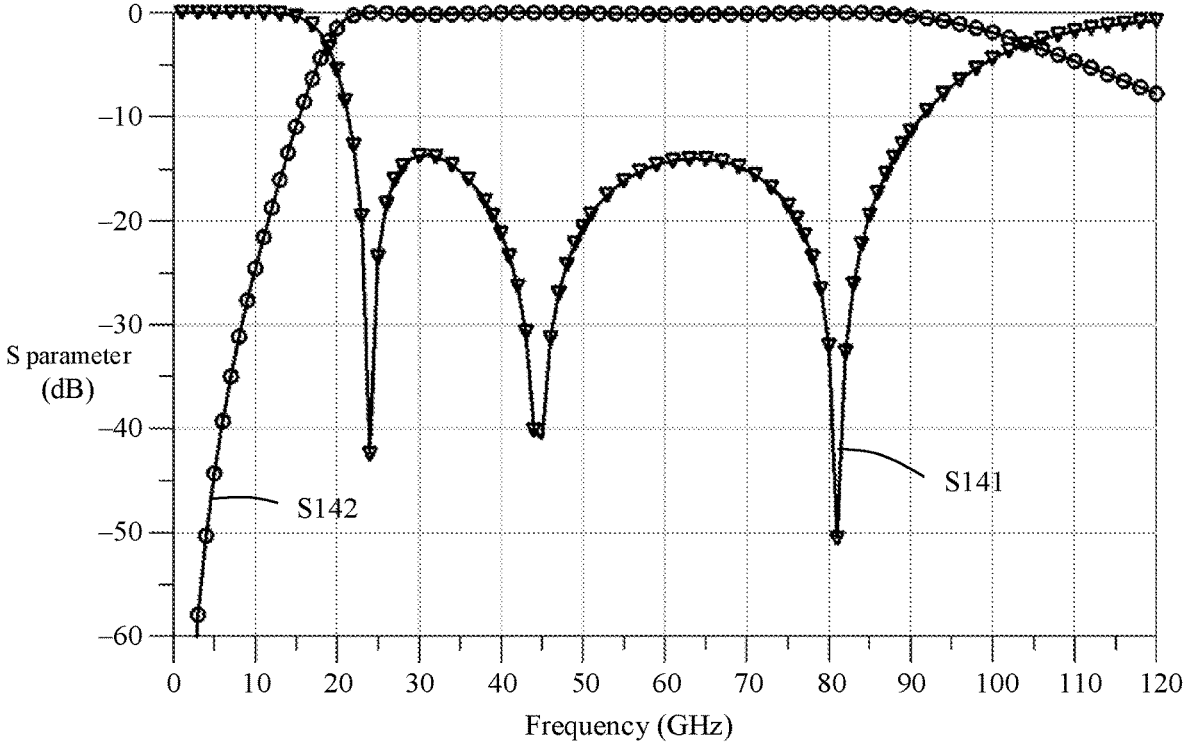
FIG. 14 is a schematic diagram of a scattering parameter (S parameter) when the radio frequency front-end circuit shown in FIG. 11 is disposed in an electronic device according to an embodiment of this application.

Refer to FIG. 14 together. To more clearly represent a radio frequency characteristic of a resonant network, performance of the resonant network is simulated according to the circuit shown in FIG. 12, to obtain a curve graph of an S parameter of the electronic device 100. A curve S141 is a reflection coefficient (S11) curve of the electronic device 100. A curve S142 is an insertion loss (IL, InsertionLoss) curve of the electronic device 100. As shown in FIG. 14, the MN 195*f*/MN 195*g* may generate three resonance points, and the three resonance points may be respectively set at 24 GHz, 45 GHZ, and 81 GHz. It is clear that, relative bandwidths of the three resonance points are 108%. In addition, when the reflection coefficient (S11) is less than or equals to −10 dB, the relative bandwidths of the three resonance points may be 115%. Certainly, in another embodiment, if a bandwidth of the electronic device 100 needs to be further increased, frequency spacings between the three resonance points may be further extended.

As described above, the first inductor Lm1, the second inductor Lm2, the third inductor Lb1, and the fourth inductor Lb2 are disposed independently. However, in another embodiment, the MN 195*f*/MN 195*g* may alternatively include only two inductors, for example, the first inductor element Lm and the second inductor element Lb, to further simplify a circuit structure of the MN 195*f*/MN 195*g*. The first inductor element Lm may generate a first inductor component and a second inductor component that are disposed in parallel. An inductance value of the first inductor component of the first inductor element Lm is equal to an inductance value of the first inductor Lm1. An inductance value of the second inductor component of the first inductor element Lm is equal to an inductance value of the second inductor Lm2. The second inductor element Lb may generate a first inductor component and a second inductor component that are disposed in parallel. An inductance value of the first inductor component of the second inductor element Lb is equal to an inductance value of the third inductor Lb1. An inductance value of the second inductor component of the second inductor element Lb is equal to an inductance value of the fourth inductor Lb2.

It may be understood that the resonant networks Q1, Q2, and Q3 jointly form a broadband design network. Specifically, the first inductor component (that is, the first inductor Lm1) of the first inductor element Lm and an equivalent capacitor (that is, the first equivalent capacitor Cn) of the first switch S1 may be used to form the resonant network Q1. Then, the secondary coil Ls of the transformer T3 and a parasitic capacitance (that is, the second equivalent capacitor Cp) of a radio frequency input port (antenna port) PAD of the LNA 193/LNA 193*g* are used to form the resonant network Q2. The first inductor component (that is, the third inductor Lb1) of the second inductor element Lb, the second inductor component (that is, the second inductor Lm2) of the first inductor element Lm, and the capacitor Cm are used to form the resonant network Q3. In this way, a broadband may be implemented, for example, a joint design of a receive front end (that is, LNA 193/LNA 193*g* and MN 195*f*/MN 195*g*) with a relative bandwidth greater than 100%.

It may be understood that, in this embodiment of this application, the MN 195*f*/MN 195*g* is disposed, to enable the electronic device 100 to implement a receiver (Rx) front-end collaboration design of a broadband millimeter wave switch and a low noise amplifier in frequency bands of n257, n258, n261, n259, n260, and n262, a 60 GHz ISM (Industrial Scientific Medical, industrial, scientific, medical) frequency band, and the like. In addition, this solution is further applicable to a broadband application such as a sub-6 GHz frequency band or a terahertz (THz) frequency band. In other words, this embodiment of this application is not limited to a specific frequency channel number.

Refer to FIG. 12 again. The second equivalent capacitor Cp, the secondary coil Ls, and the first equivalent capacitor Cn may form a first filter P1. The first inductor element Lm, the capacitor Cm, and the second equivalent inductor Lb form a second filter P2. The first filter P1 is a 3-order π-type low-pass filter, and the second filter P2 is a 3-order π-type high-pass filter. In this way, the MN 195*g* may also be considered as cascading the 3-order π-type low-pass filter and the 3-order π-type high-pass filter to implement a broadband band-pass filter. In other words, in a design of the radio frequency front-end circuit 191*g*, the secondary coil Ls may be used to form a plurality of resonant networks (for example, the resonant networks Q1 to Q3) or form a high- and low-pass filter (that is, a band-pass filter), to perform input and noise matching of a broadband LNA.

In addition, as described above, the first inductor component (that is, the first inductor Lm1) of the first inductor element Lm and the equivalent capacitor (that is, the first equivalent capacitor Cn) of the first switch S1 form the resonant network Q1. In addition, a component of the first inductor element Lm (for example, the second inductor component, that is, the second inductor Lm2) is also a component of the resonant network Q3. To be specific, the second inductor component (that is, the second inductor Lm2) of the first inductor element Lm, the first inductor component (that is, the third inductor Lb1) of the second inductor element Lb, and the capacitor Cm form the resonant network Q3. In addition, an inductor component (for example, the second inductor component, that is, the fourth inductor Lb2) of the second inductor element Lb is also a component of the bias circuit 196 of the LNA 195*g*. In other words, in this embodiment of this application, the radio frequency front-end circuit 191*g* may reuse an inductor, further simplifying a circuit structure of the radio frequency front-end circuit 191*g* and effectively reducing costs. In addition, the radio frequency front-end circuit 191*g* may further effectively reduce deterioration of a gain, a noise figure, a power added efficiency (Power Added Efficiency, PAE), linearity, and the like, and does not cause an increase of an overall circuit area.

Figure 15A:
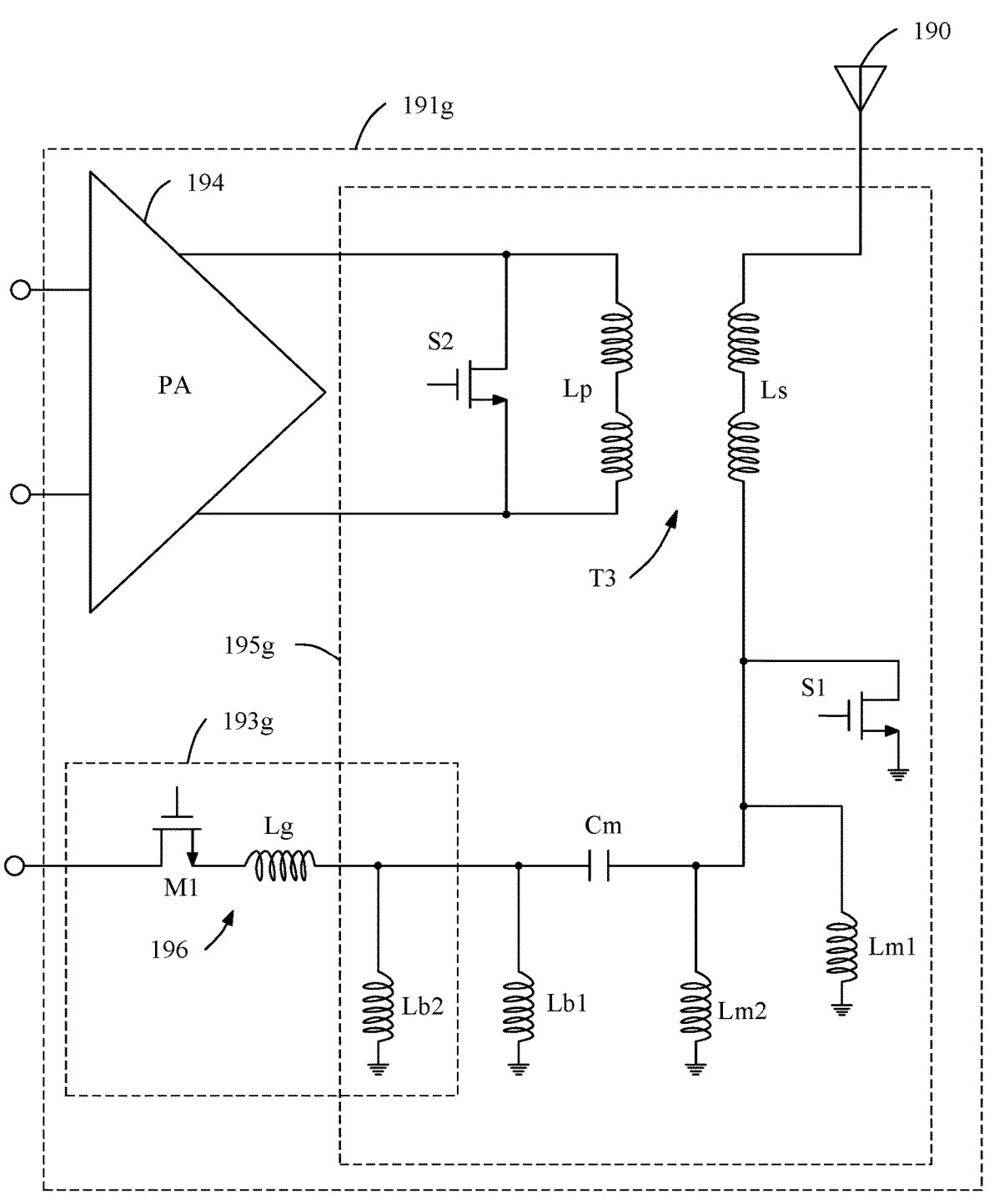
FIG. 15a and FIG. 15b are schematic diagrams of another circuit of a radio frequency front-end circuit and an antenna according to an embodiment of this application.
Figure 15B:
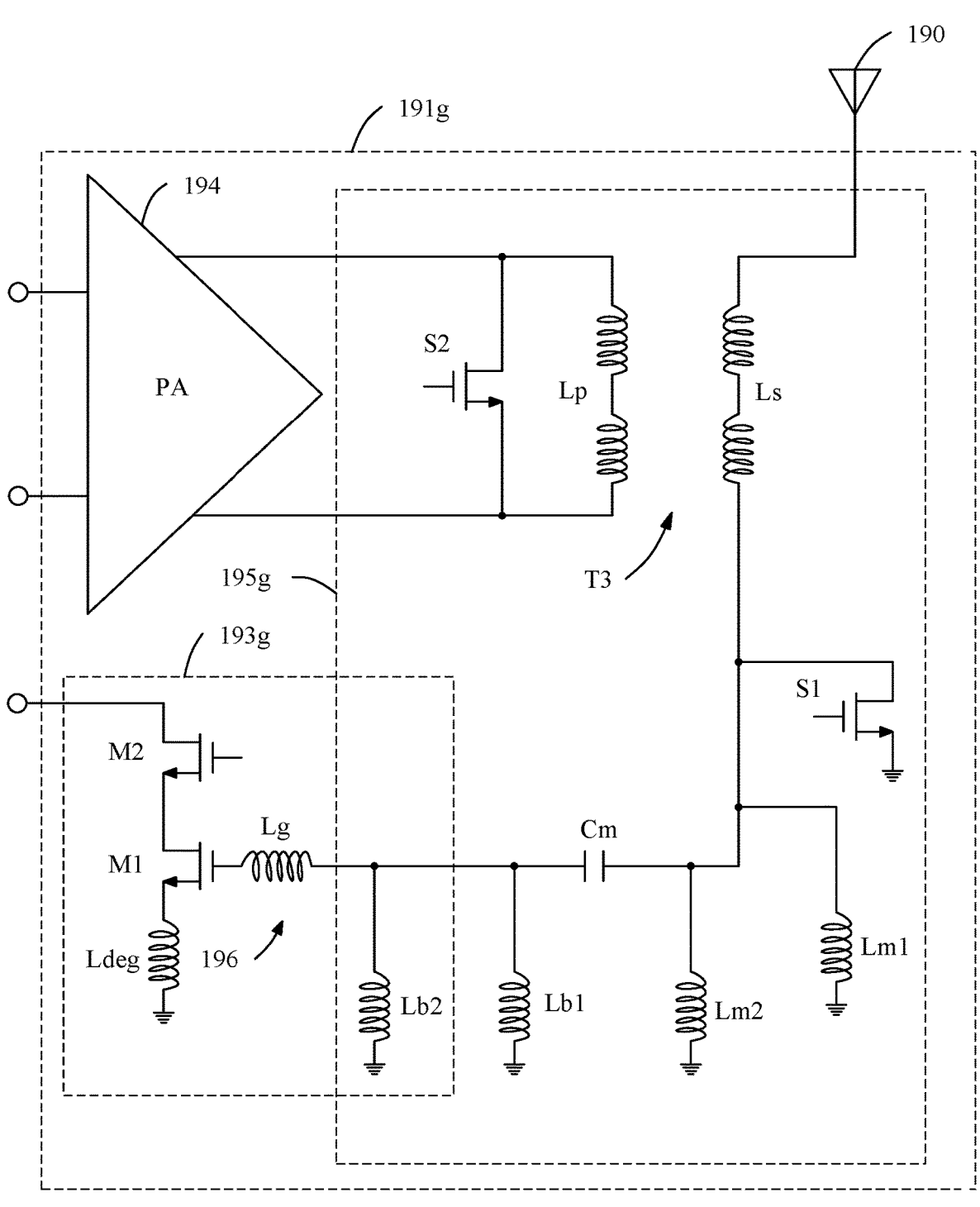

It may be understood that, as shown in FIG. 11, in this embodiment of this application, the bias circuit 196 of the LNA 193*g* uses a common-source architecture as an example. Certainly, during actual application, the bias circuit 196 of the LNA 193*g* is not limited to a common-source architecture, and may alternatively be a common-gate architecture, a cascode architecture, or the like (refer to FIG. 15*a* and FIG. 15*b*). This is not specifically limited herein. For example, as shown in FIG. 15*a*, the bias circuit 196 forms a common-gate architecture, and does not include the sixth inductor Ldeg. One end of the fifth inductor Lg is grounded through the fourth inductor Lb2 that is connected in series to the fifth inductor Lg, and the other end is electrically connected to the source of the switching transistor M1. The drain of the switching transistor M1 is configured to output the radio frequency signal. For another example, as shown in FIG. 15*b*, the bias circuit 196 forms a cascode architecture. The bias circuit 196 further includes a switching transistor M2. The drain of the switching transistor M1 is electrically connected to a source of the switching transistor M2, and a drain of the switching transistor M2 is configured to output a radio frequency signal.

It may be understood that an antenna in package (Antenna in Package, AiP) is a technology that integrates an antenna and a chip into a package based on a packaging material and a process, to implement a system-level wireless function. Advantages of the antenna in package include simplified system design, product miniaturization, and low costs. The AiP technology complies with a trend of improving integration of silicon-based semiconductor processes and provides a good antenna and packaging solution for system-level wireless chips. With rapid development of communication information, the AiP technology has become a mandatory technology for 5G (5th Generation) communication and vehicle radar chips. Therefore, the AiP technology has attracted wide attention.

Figure 16:
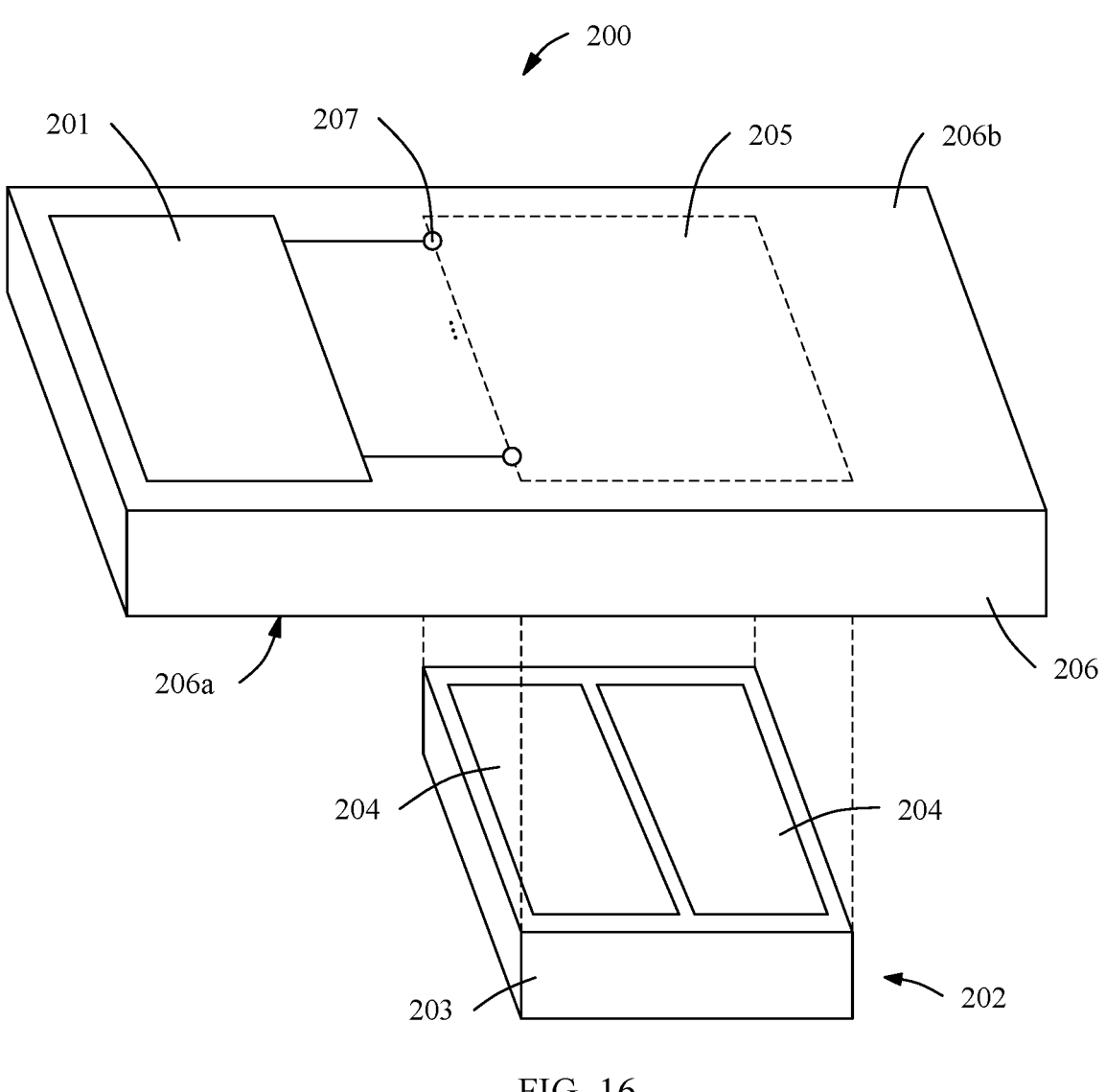
FIG. 16 is a schematic diagram of a radio transceiver apparatus according to an embodiment of this application.

It may be understood that, refer to FIG. 16, an embodiment of this application further provides a radio transceiver apparatus 200. As shown in FIG. 16, the radio transceiver apparatus 200 includes an antenna 201 and a radio frequency front-end integrated circuit (radio frequency front-end integrated circuit, RFFE IC) 202. The antenna 201 may be the antenna 190 described above. The RFFE IC 202 may be the radio frequency front-end circuits 191 and 191*a* to 191*g* described above, and includes at least the MN 195 and MN 195*a* to MN 195*g* described above.

The RFFE IC 202 may be implemented on a die (die) 203 and includes at least one partition 204. For example, as shown in FIG. 16, an example in which the RFFE IC 202 includes two partitions 204 is used for description. Each partition 204 is associated with a particular frequency band (for example, a millimeter wave band) and includes one or more transceiver chains. For example, one of the partitions 204 supports a first frequency band (for example, generating or processing signals of the first frequency band), and the other partition 204 supports a second frequency band (for example, generating or processing signals of the second frequency band).

The RFFE IC 202 may be mounted to a first surface 206*a* of a substrate 206 through an interface 205. In this embodiment of this application, the first surface 206*a* is a lower surface of the substrate 206. As such, the two partitions 204 face the first surface 206*a* of the substrate 206. The interface 205 disposed on the first surface 206*a* is configured to be admitted and connected to the die (die) 203. The interface 205 includes a plurality of terminals 207, where a quantity of terminals 207 is corresponding to a quantity of feed ports associated with the antenna 201. Certainly, in another embodiment of this application, the interface 205 may further include another terminal that connects the RFFE IC 202 to another component. This is not specifically limited herein.

In this embodiment of this application, the transceiver chain in the partition 204 is coupled to the antenna 201 through the interface 205 and the terminal 207. In FIG. 16, the antenna 201 is on a second surface 206*b* of the substrate 206 (for example, on a surface opposite to the first surface 206*a* mounted to the RFFE IC 202). The second surface 206*b* is an upper side of the substrate 206. That is, the antenna 201 is disposed back to the RFFE IC 202.

FIG. 17 shows a schematic flowchart of a tuning method according to an embodiment of this application. The method may be applied to an electronic device including a matching network (MN). As shown in FIG. 17, the following describes in detail the tuning method in this embodiment of this application by using an electronic device including an MN 195*f*/MN 195*g* as an example. The method may include the following steps.

S171: The electronic device receives a radio frequency signal, for example, an Rx signal, on a network side through an antenna 190.

S172: The MN 195*f*/MN 195*g* receives a radio frequency signal from the antenna 190, and tunes the radio frequency signal for a plurality of times, to enable the electronic device to operate in a plurality of frequency bands.

For example, in this embodiment of this application, the MN 195*g* may perform first tuning on the received radio frequency signal by using a resonant network Q1, perform second tuning on the received radio frequency signal by using a resonant network Q2, and then perform third tuning on the received radio frequency signal by using a resonant network Q3.

It may be understood that, in this embodiment of this application, impedance matching or tuning may be performed on a radio frequency front-end circuit 191*f*/191*g* by tuning the MN 195*f*/MN 195*g* for a plurality of times, to enable the electronic device to operate in a plurality of frequency bands, for example, frequency bands of n257, n258, n261, n259, n260, and n262, and a 60 GHz ISM (Industrial Scientific Medical, industrial, scientific, medical) frequency band, and implement a broadband, for example, a relative bandwidth is greater than 100%. In addition, the radio frequency front-end circuit 191*f*/191*g* may further effectively reduce deterioration of a gain, a noise figure, a PAE, linearity, and the like, and does not cause an increase of an overall circuit area.

FIG. 18 shows an electronic device 300 according to this application. The electronic device 300 includes at least one processor 301, a memory 302, a radio frequency front-end circuit 303, and an antenna 304. The processor 301 is coupled to the memory 302, the radio frequency front-end circuit 303, and the antenna 304.

In this embodiment of this application, the processor 301 may be a general-purpose processor, a digital signal processor, an application-specific integrated circuit, a field programmable gate array or another programmable logic device, a discrete gate or a transistor logic device, or a discrete hardware device, and may implement or perform the methods, steps, and logical block diagrams disclosed in embodiments of this application. The general-purpose processor may be a microprocessor or any conventional processor or the like.

In this embodiment of this application, the memory 302 may be a nonvolatile memory, a hard disk drive (hard disk drive, HDD) or a solid-state drive (solid-state drive, SSD), or may be a volatile memory (volatile memory), for example, a random access memory (random access memory, RAM). A memory is any other medium that can be configured to carry or store expected program code in a form of an instruction or a data structure and that can be accessed by a computer, but is not limited thereto. The memory in this embodiment of this application may alternatively be a circuit or any other apparatus that can implement a storage function, and is configured to store program instructions and/or data.

It may be understood that the radio frequency front-end circuit 303 may be the radio frequency front-end circuit 191, 191*a*, 191*b*, 191*c*, 191*d*, 191*e*, 191*f* or 191*g* described above, and includes at least an MN 305. The MN 305 may be the 195, 195*a*, 195*b*, 195*c*, 195*d*, 195*e*, 195*f* or 195*g* described above. The electronic device 300 may tune the antenna 304 through the MN 305, to enable the antenna 304 to operate in a plurality of frequency bands and have a high relative bandwidth, for example, the relative bandwidth is greater than 100%. In this way, the tuning method in this embodiment of this application can be implemented. For specific related features of the tuning method, refer to the foregoing descriptions. Details are not described herein again.

It should be understood that the implementations of this application may be randomly combined, for example, may be used separately, or may be used in combination with each other, to implement different technical effects. This is not limited herein.

The foregoing content is merely specific implementations of this application, but is not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. An electronic device, comprising:
an antenna;
a matching circuit coupled to the antenna, the matching circuit comprising:
  a power amplifier;
  a transformer electrically connected to the power amplifier and to the antenna;
  a low noise amplifier;
  a capacitor, a first end of the capacitor is electrically connected to the transformer, and a second end of the capacitor is electrically connected to the low noise amplifier;
  a first switch, one end of the first switch is electrically connected between the capacitor and the transformer, and the other end of the first switch is grounded; and
  a first inductor element, one end of the first inductor element is electrically connected between the capacitor and the first switch, and the other end of the first inductor element is grounded.

2. The electronic device according to claim 1, wherein the first inductor element and the first switch generate a first resonance point and the transformer and the antenna generate a second resonance point.

3. The electronic device according to claim 1, wherein the matching circuit further comprises a second inductor element, one end of the second inductor element is electrically connected between the capacitor and the low noise amplifier and the other end of the second inductor element is grounded.

4. The electronic device according to claim 3, wherein the capacitor, the first inductor element and the second inductor element generate a third resonance point.

5. The electronic device according to claim 3, wherein the capacitor, the first inductor element, and the second inductor element form a 3-order π-type high-pass filter.

6. The electronic device according to claim 4, wherein the capacitor, the first inductor element and the second inductor element form a 3-order π-type high-pass filter.

7. The electronic device according to claim 3, wherein the low noise amplifier comprises a bias circuit including the second inductor element.

8. The electronic device according to claim 1, wherein the low noise amplifier comprises a bias circuit coupled to the capacitor to form a common-source architecture.

9. The electronic device according to claim 8, wherein the bias circuit comprises a switching transistor and first and second inductors, one end of the first inductor is electrically connected to the capacitor, the other end is electrically connected to a gate of the switching transistor, a source of the switching transistor is grounded through the second inductor, and a drain of the switching transistor is configured to output a radio frequency signal.

10. The electronic device according to claim 1, wherein the low noise amplifier comprises a bias circuit, and the bias circuit is coupled to the capacitor and forms a common-gate architecture or a cascode architecture.

11. A radio transceiver, comprising:
an antenna; and
a radio frequency front-end circuit coupled to the antenna, the radio frequency front-end circuit comprising:
  a low noise amplifier;
  a power amplifier; and
  a matching circuit comprising:
    a transformer electrically connected to the power amplifier and to the antenna;
    a capacitor, a first end of the capacitor is electrically connected to the transformer, and a second end of the capacitor is electrically connected to the low noise amplifier;
    a first switch, a first end of the first switch is electrically connected between the capacitor and the transformer, and a second end of the first switch is grounded; and
    a first inductor element, a first end of the first inductor element is electrically connected between the capacitor and the first switch, and a second end of the first inductor element is grounded.

12. The radio transceiver apparatus according to claim 11, wherein the first inductor element and the first switch generate a first resonance point, and the transformer and the antenna generate a second resonance point.

13. The radio transceiver apparatus according to claim 11, wherein the matching circuit further comprises a second inductor element, a first end of the second inductor element is electrically connected between the capacitor and the low noise amplifier, and a second end of the second inductor element is grounded.

14. The radio transceiver apparatus according to claim 13, wherein the capacitor, the first inductor element, and the second inductor element generate a third resonance point.

15. The radio transceiver apparatus according to claim 13, wherein the capacitor, the first inductor element, and the second inductor element form a 3-order π-type high-pass filter.

16. The radio transceiver apparatus according to claim 14, wherein the capacitor, the first inductor element, and the second inductor element form a 3-order π-type high-pass filter.

17. The radio transceiver apparatus according to claim 13, wherein the low noise amplifier comprises a bias circuit, and the bias circuit comprises the second inductor element.

18. The radio transceiver apparatus according to claim 11, wherein the low noise amplifier comprises a bias circuit, and the bias circuit is coupled to the capacitor and forms a common-source architecture.

19. The radio transceiver apparatus according to claim 18, wherein the bias circuit comprises a switching transistor and two inductors, one end of one of the two inductors is electrically connected to the capacitor, the other end is electrically connected to a gate of the switching transistor, a source of the switching transistor is grounded through the other inductor of the two inductors, and a drain of the switching transistor is configured to output a radio frequency signal.

20. The radio transceiver apparatus according to claim 11, wherein the low noise amplifier comprises a bias circuit, and the bias circuit is coupled to the capacitor and forms a common-gate architecture or a cascode architecture.

* * * * *